United States Patent
Chen

(10) Patent No.: US 6,947,874 B2
(45) Date of Patent: Sep. 20, 2005

(54) ENTROPY CODING

(75) Inventor: Yu-Ling Chen, Epping (AU)

(73) Assignee: Canon Kabushiki Kaisha, Tokyo (JP)

(*) Notice: Subject to any disclaimer, the term of this patent is extended or adjusted under 35 U.S.C. 154(b) by 367 days.

(21) Appl. No.: 09/987,230

(22) Filed: Nov. 14, 2001

(65) Prior Publication Data
US 2002/0107669 A1 Aug. 8, 2002

(30) Foreign Application Priority Data

Nov. 16, 2000 (AU) ............................................. PR1519
Nov. 16, 2000 (AU) ............................................. PR1520

(51) Int. Cl.[7] ............................................. G06F 15/00
(52) U.S. Cl. ..................... 702/189; 341/107; 382/247
(58) Field of Search .......................... 702/66, 122, 124, 702/179, 189–190; 341/56, 107; 382/239–240, 247–248; 358/426.01–426.16

(56) References Cited

U.S. PATENT DOCUMENTS

| | | | |
|---|---|---|---|
| 5,241,395 A | * 8/1993 | Chen | 358/426.14 |
| 5,272,478 A | * 12/1993 | Allen | 341/107 |
| 5,539,468 A | 7/1996 | Suzuki et al. | 348/403 |
| 6,125,201 A | * 9/2000 | Zador | 382/166 |
| 6,141,446 A | * 10/2000 | Boliek et al. | 382/233 |
| 6,195,465 B1 | * 2/2001 | Zandi et al. | 382/248 |
| 6,229,927 B1 | * 5/2001 | Schwartz | 382/248 |
| 6,668,090 B1 | * 12/2003 | Joshi et al. | 382/239 |

FOREIGN PATENT DOCUMENTS

| | | | |
|---|---|---|---|
| AU | 724222 | 4/1999 | ............ H04N/7/34 |
| EP | 1 009 168 A2 | 6/2000 | ............ H04N/7/26 |

OTHER PUBLICATIONS

Queiroz et al., "Wavelet Transforms in a JPEG–Like Image Coder", Apr. 1997, IEEE Transactions on Circuits and Systems for Video Technology, vol. 7 No. 2, pp. 419–424.*

* cited by examiner

Primary Examiner—Patrick J. Assouad
Assistant Examiner—Mary Catherine Baran
(74) Attorney, Agent, or Firm—Fitzpatrick, Cella, Harper & Scinto

(57) ABSTRACT

A method, an apparatus (100) and a computer program product for entropy coding of discrete wavelet transform (DWT) coefficient bits that are arranged into code blocks and coded in bitplane order using three coding passes for each bitplane are disclosed. In the method, transform coefficients of a code block (200) in sign-magnitude form are pre-analyzed. Statistical data about the coefficients is stored, preferably with the coefficients. Significance state data (330), coded data (340), magnitude refinement data (350), bit data (310), and sign data (320) for the code block are buffered. More preferably, the buffering is implemented using a FIFO (120, 1130), located between a context generation module (110, 1120) and an arithmetic coder (130, 1150). Based upon the statistical data, at least one command for at least one sequence of bit and context pairs is generated for arithmetic encoding.

46 Claims, 29 Drawing Sheets

|   |   |   |   |
|---|---|---|---|
| 1 | 2 | 3 | 4 |
| 5 | 6 | 7 | 8 |
| 9 | 10 | 11 | 12 |
| 13 | 14 | 15 | 16 |

ENTROPY CODING

FIELD OF THE INVENTION

The present invention relates generally to the field of encoding of digital images and more particularly to entropy coding of discrete wavelet transform (DWT) coefficient bits.

BACKGROUND

Since the 1980's, the Joint Photographic Experts Group (JPEG) standard for the coding of digital images has been widely used as an international standard for efficiently coding continuous-tone images, JPEG has a number of different modes including sequential, progressive, lossless, and hierarchical encoding. Numerous adaptations of this technique have been made. Nonetheless, an improved image compression system has been sought that allows greater flexibility for access to compressed data as well as for the compression of images than hitherto provided.

One such proposal has been the JPEG 2000 image coding system set out in the JPEG 2000 Part I Final Draft International Standard (ISO/IEC JTC 1/SC 29/WG 1) dated 25 Sep. 2000. Amongst other things, this system provides sophisticated features allowing a single codestream to be used efficiently in numerous applications including manipulating a codestream without decoding, matching a codestream to a transmission channel, and locating and extracting data without decoding.

SUMMARY

In accordance with a first aspect of the invention, there is provided a method of entropy coding of discrete wavelet transform (DWT) coefficient bits that are arranged into code blocks and coded in bitplane order using three coding passes for each bitplane. The method includes the steps of: pre-analyzing transform coefficients of a code block in sign-magnitude form; storing statistical data about the coefficients; and based upon the statistical data, generating at least one command for at least one sequence of bit and context pairs for arithmetic encoding.

Preferably, the entropy coding is JPEG 2000 entropy coding.

Preferably, the statistical data is stored with the coefficients.

Preferably, the method includes the step of buffering significance state data, coded data, magnitude refinement data, bit data, and sign data for the code block. More preferably, the buffering step is implemented using register arrays for context generation. Optionally, the method includes the step of switching to a specific region of the code block in any one of significance propagation, magnitude refinement, and cleanup coding passes. Optionally, the switching step is implemented using rotate-left and rotate-right operations of the register arrays.

Preferably, the method further includes the step of buffering bit and context data before arithmetic coding using the bit and context data. The bit, context and the number of a bit and context pair may be buffered. More preferably, the buffering step is implemented using a FIFO.

Preferably, the method further includes the steps of buffering a region of a code block, the region being currently coded; and buffering separately the remaining regions of the code block.

Preferably, the buffering step for the region currently being coded is implemented using a register window, and the buffering step for the remaining regions is implemented using a scratch memory.

Preferably, the method further includes the steps of: looking for, using a bypass control module, the next region of a code block to be coded in each of significance propagation, magnitude refinement, and cleanup coding passes; and generating, using a context generation module, a context of a region previously provided by the bypass control module, the bypass control and context generations modules operating in parallel. More preferably, the method includes the step of communicating data between the bypass control and context generation modules using a bus. The bus includes a control bus and a data bus. The control bus provides an indication of which column to start in a region when the context generation module processes the region. Still further, the method may include the step of detecting termination of processing in the context generation module for each pass. The detected termination enables coding in the region to be terminated before scanning to a last column.

In accordance with a second aspect of the invention, there is disclosed an apparatus for entropy coding of discrete wavelet transform (DWT) coefficient bits that are arranged into code blocks and coded in bitplane order using three coding passes for each bitplane. The apparatus includes:

a device for pre-analyzing transform coefficients of a code block in sign-magnitude form;

a device for storing statistical data about the coefficients; and a device for, based upon the statistical data, generating at least one command for at least one sequence of bit and context pairs for arithmetic encoding.

In accordance with a third aspect of the invention, there is disclosed a computer program product having a computer readable medium having a computer program recorded therein for entropy coding of discrete wavelet transform (DWT) coefficient bits that are arranged into code blocks and coded in bitplane order using three coding passes for each bitplane. The computer program product includes:

a computer program code module for pre-analyzing transform coefficients of a code block in sign-magnitude form;

a computer program code means for storing statistical data about the coefficients; and a computer program code means for, based upon the statistical data, generating at least one command for at least one sequence of bit and context pairs for arithmetic encoding.

In accordance with a fourth aspect of the invention, there is disclosed an apparatus for entropy coding of discrete wavelet transform (DWT) coefficient bits that are arranged into code blocks and coded in bitplane order using three coding passes for each bitplane. The apparatus includes: a context generator for generating a context for each bit of one or more coefficients in a code block; an arithmetic coder for entropy coding each bit to be coded from the code block using the context for the bit; and a FIFO coupled between the context generator and the arithmetic coder for streamlining transfer of data between the context generator and the arithmetic coder, the FIFO adapted to store each bit, the corresponding context and a repeat number of the bit and context pair.

Preferably, the entropy coding is JPEG 2000 entropy coding.

Preferably, the context generator includes a device for generating a repeat pattern of two or more bit and context pairs in a single clock cycle. A run length repeat command may represent the repeat pattern. Still more preferably, the FIFO stores the run length repeat command as the repeat number.

The context generator provides context at variable rates.

Preferably, the arithmetic coder includes a device for accelerating coding of a codestream using the repeat pattern. The arithmetic coder may further include a device for calculating a repeat count r for two or more bits dependent upon an interval A and a current estimate of LPS probability Qe(I(CX)), where I(CX) is an index stored for a context CX. Still further, the arithmetic coder may further include: a device for entropy encoding the two or more bits in a Run Length context using one of the repeat count r and the repeat number dependent upon whether the repeat count r is greater than the repeat number.

In accordance with a fifth aspect of the invention, there is disclosed a method of entropy coding of discrete wavelet transform (DWT) coefficient bits that are arranged into code blocks and coded in bitplane order using three coding passes for each bitplane. The method includes the steps of: generating a context for each bit of one or more coefficients in a code block; arithmetic coding each bit to be coded from the code block using the context for the bit; and buffering using a FIFO to streamline transfer of data between the context generating step and the arithmetic coding step, the FIFO adapted to store each bit, the corresponding context and a repeat number of said bit and context pair.

In accordance with a sixth aspect of the invention, there is disclosed a computer program product having a computer readable medium having a computer program recorded therein for entropy coding of discrete wavelet transform (DWT) coefficient bits that are arranged into code blocks and coded in bitplane order using three coding passes for each bitplane. The computer program product includes: a computer program code module for generating a context for each bit of one or more coefficients in a code block; a computer program code module for arithmetic coding each bit to be coded from the code block using the context for the bit; and a computer program code module for providing a FIFO between the context generating and the arithmetic coding to streamline transfer of data between the context generator and the arithmetic coder, the FIFO adapted to store each bit, the corresponding context and a repeat number of the bit and context pair.

BRIEF DESCRIPTION OF THE DRAWINGS

Embodiments of the invention are described hereinafter with reference to the drawings, in which.

DETAILED DESCRIPTION

Figure 1:
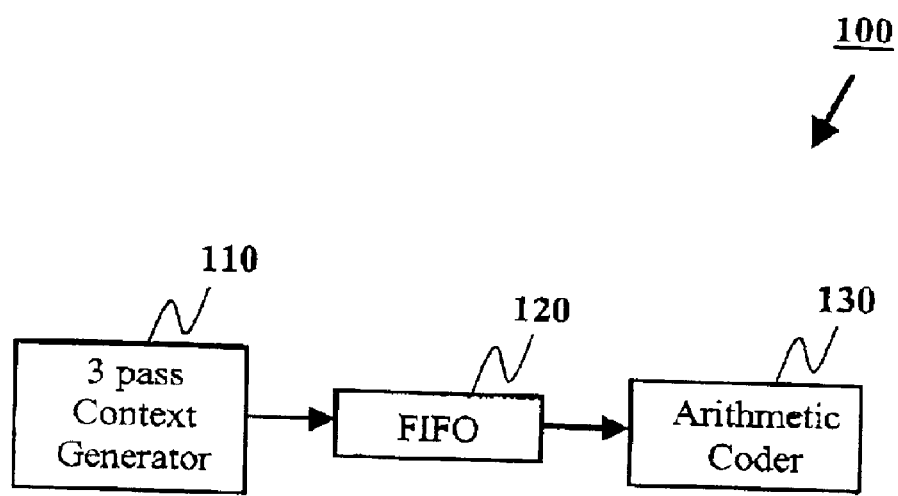
FIG. 1 is a block diagram of an entropy coder in accordance with the first embodiment of the invention.

A method, an apparatus, and a computer program product are disclosed for entropy encoding of discrete wavelet transform (DWT) coefficient bits that are arranged into code blocks and coded in bitplane order using three coding passes for each bitplane. Preferably, the entropy coding is JPEG 2000 entropy coding. In the following description, numerous details are set forth. It will be apparent to one skilled in the art, however, that the present invention may be practiced without these specific details. In other instances, well-known features are not described in detail so as not to obscure the present invention.

In the following description, components of the entropy encoding system are described as modules. A module, and in particular its functionality, can be implemented in either hardware or software. In the software sense, a module is a process, program, or portion thereof, that usually performs a particular function or related functions. In the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist. Those skilled in the art will appreciate that the system can also be implemented as a combination of hardware and software modules.

The detailed description is organised as follows:
1. Overview
2. Context Generation—Register Array Based Method
3. Context Generation—Memory and Register Window Based Method
4. Context Label Generator
5. Arithmetic Coder
6. Computer Implementation.

While the specification refers hereinafter to JPEG 2000 throughout, it will be apparent to those skilled in the art that the embodiments of the invention may appertain to JPEG 2000 like systems, i.e. where JPEG 2000 is not practiced exactly, but is in substance utilised with some modification.

1. Overview

In the JPEG 2000 encoding draft, a discrete wavelet transform (DWT) coefficient bits are arranged into code-blocks and coded in bitplane order using three coding passes for each bit plane. A code-block is defined as a rectangular block within a sub-band. The coefficients inside the code-block are coded a bitplane at a time, starting with the most significant bitplane having a non-zero element and ending with the least significant bit-plane.

For each bitplane in a code-block, a special code-block scan pattern is used for each of significance-propagation, magnitude refinement, and cleanup passes. Each coefficient bit is coded only once in one the three passes. The pass in which a coefficient bit is coded depends on the conditions for that pass. For each pass, contexts are created using the significance states of 8 neighbouring coefficient bits of the coefficient bit currently being coded. The context is passed to an arithmetic coder along with the bit stream to effect entropy coding.

As the coding of each bitplane requires a three-pass scan and the context look-up from eight neighbouring coefficient bits, the embodiments of the invention provide appropriate buffering for the coefficient bits and their significance states of the coded bit and the neighbours to enable speedy coding. The buffered coefficient bits and their significance states enable the coding process to switch to the next position for coding on the fly in each pass. Thus, the delay involved in the conventional 3 pass one-by-one scan method is avoided.

The arithmetic coder is capable of coding one bit per clock cycle, even though a context generator does not deliver context at a constant speed. As a result, a FIFO is used to streamline the data between the context generator and the arithmetic coder in accordance with an embodiment of the invention as shown in FIG. 1.

FIG. 1 is a block diagram illustrating the entropy encoder 100 in accordance with an embodiment of the invention. Besides providing a general representation, FIG. 1 illustrates a first embodiment of the invention. The entropy coder 100 includes a 3-pass context generator module 110, a FIFO 120, and an arithmetic coder 130. The FIFO 120 buffers the output provided by the context generator module 110 to be provided to the arithmetic coder 130. The context generator 120, arithmetic coder 130, and the FIFO 120 are described in greater detail hereinafter.

2. Context Generation—Register Array Based Method

Figure 2:
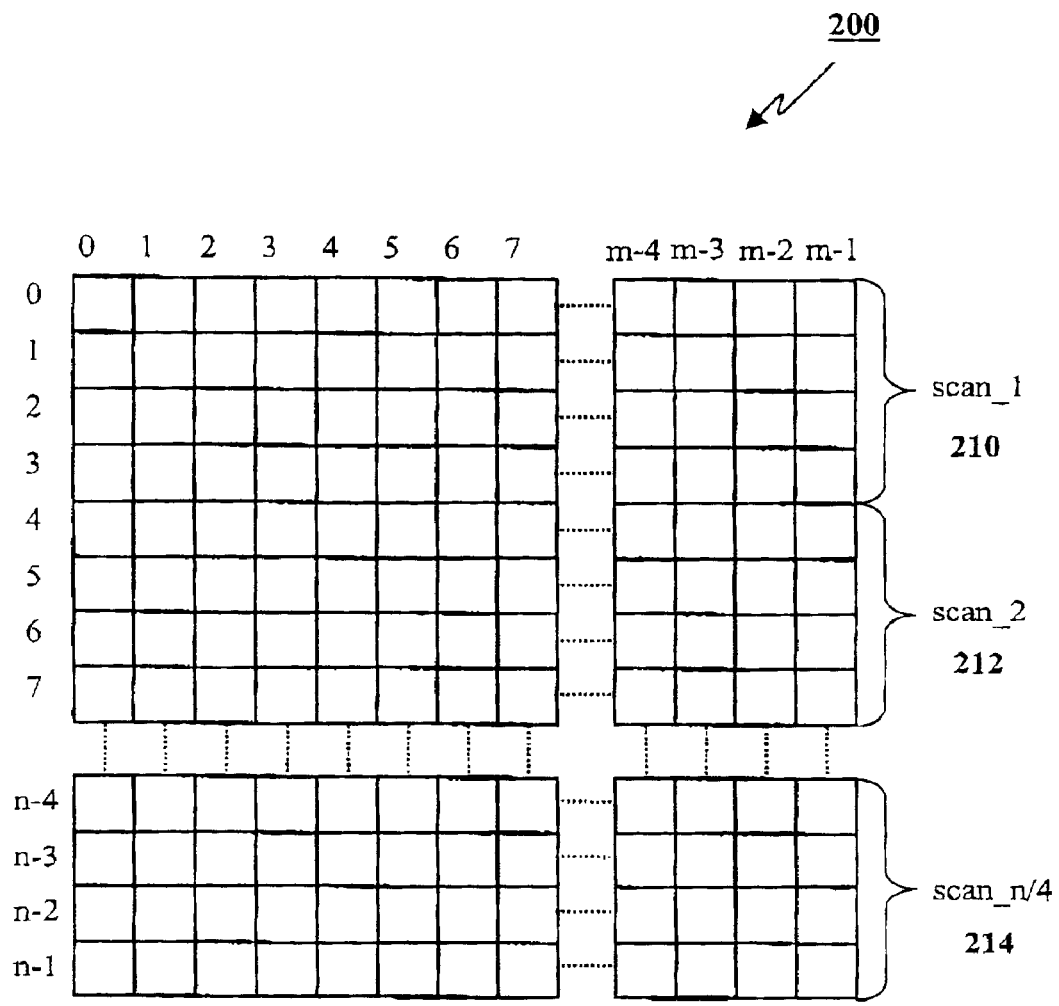
FIG. 2 is a diagram illustrating an array for buffering of a code block in accordance with the embodiments of the invention.

A buffering array 200 for a code-block is shown in FIG. 2. The array 200 has the same dimensions m×n as a code-block, having a width and a height that are constrained to the power of 2. The array 200 is further divided into scans, named scan_1 210, scan_2 212 and so on to scan_n/4 214 as per the scan pattern used in 3 passes.

Figure 3:
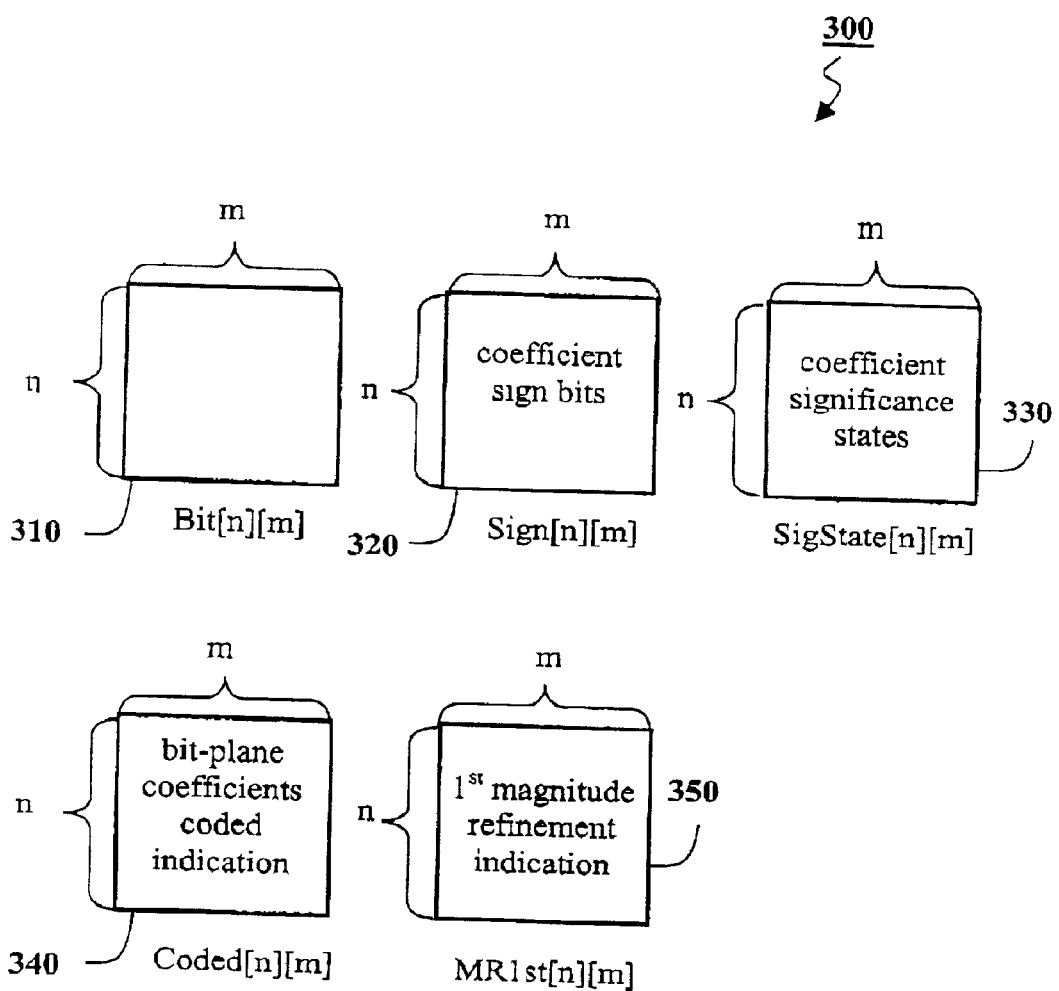
FIG. 3 is a diagram illustrating five arrays used in the embodiments of the invention for storing information regarding a code block.

As shown in FIG. 3, there are 5 arrays for the bit plane coefficients bits 310, signs of coefficients 320, significance states of coefficients 330, coded indications for bitplane coefficients 340 and $1^{st}$ magnitude refinement indications 350 respectively. These 5 arrays are named Bit[n][m] 310, Sign[n][m] 320, SigState[n][m] 330, Coded[n][m] 340 and MR1st[n][m] 350 used in the coding process.

The notation ArrayName[r][c] denotes the bit located in row r and column c for the named array. Scan_1[c] means the 4 bits in column c of scan_1 (e.g. column 0 or C=0). ArrayName[r] represents all bits in row r of the named array.

The Bit array 310 is updated with coefficient bits of a bit-plane before coding is performed on that bit-plane. The Sign array 320 is updated once only for a code-block with sign information for the coefficients. Each bit in the SigState array 330 is set when a corresponding coefficient turns significant. Each bit in the Coded array 340 is set when a corresponding bit in a bit-plane is coded in a particular pass. The bit in MR1st array 350 is set when a corresponding coefficient turns significant and is cleared after the corresponding coefficient finishes coding its first Magnitude Refinement bit.

2.1 Encoding Process

The encoding process generates a context for each one of a block of DWT transformed coefficients, which are converted to sign-magnitude format and stored in memory. The first bit-plane with a non-zero element is found using the sign-magnitude format conversion process, and the bit-plane number is then ready to be used.

Figure 5:
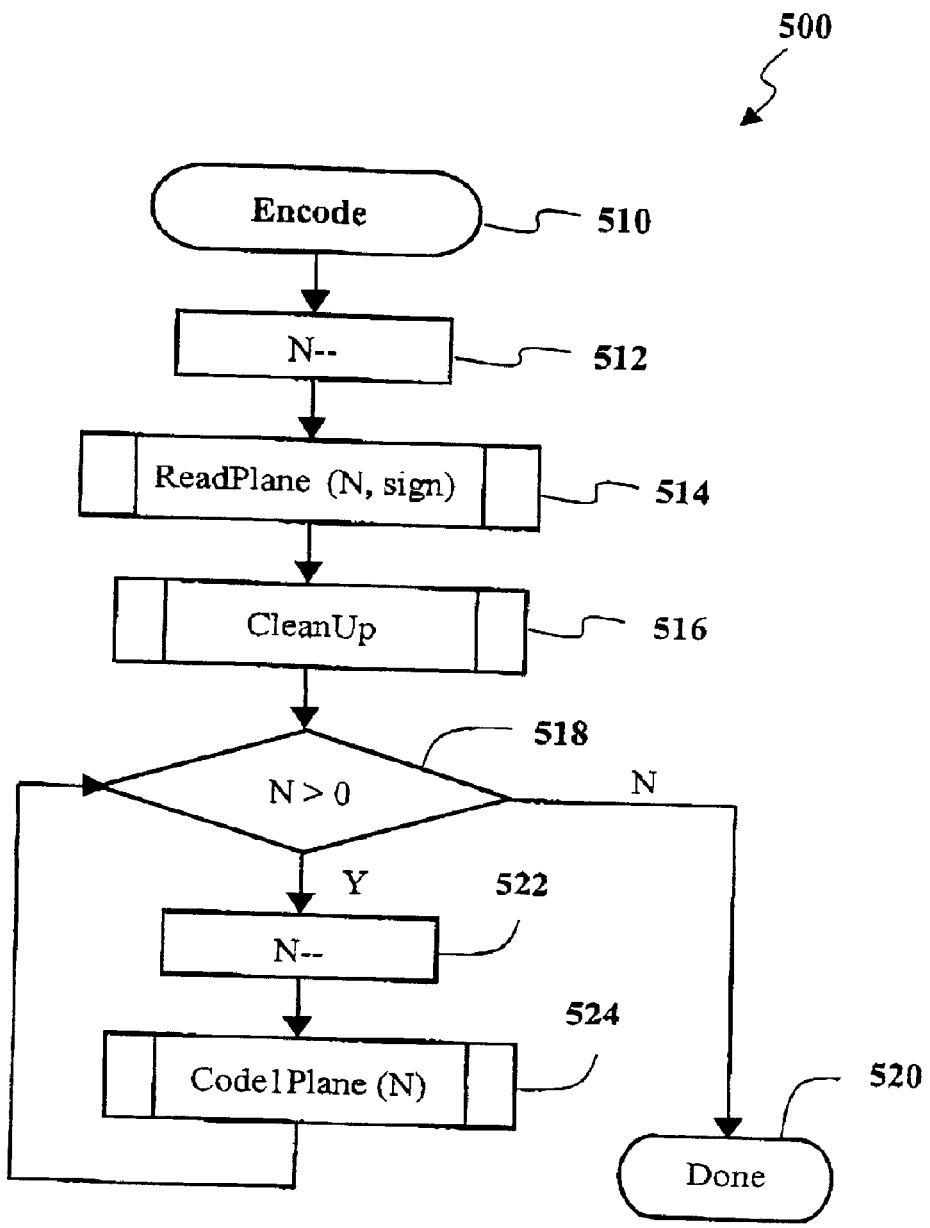
FIG. 5 is a flow diagram illustrating the entropy encoding process with which the embodiments of the invention can be practiced.

FIG. 5 is a flow diagram illustrating the encoding process 500. A block of sign-magnitude format converted coefficients are stored in memory along with the number of significant bit-planes. The number of significant bit-planes in a code-block is denoted as N and indicates the number of bit-planes to be coded. The first bit-plane with a non-zero element, bit-plane(N−1), is first read by a ReadPlane (N, sign) process and then coded using a cleanup pass only. The rest of the bit-planes are then coded using a Code1Plane(N) process.

Upon the start of encoding a code-block in step 510, the SigState array 330 is reset. In step 512, the number of significant bit planes N is decremented.

Figure 10:
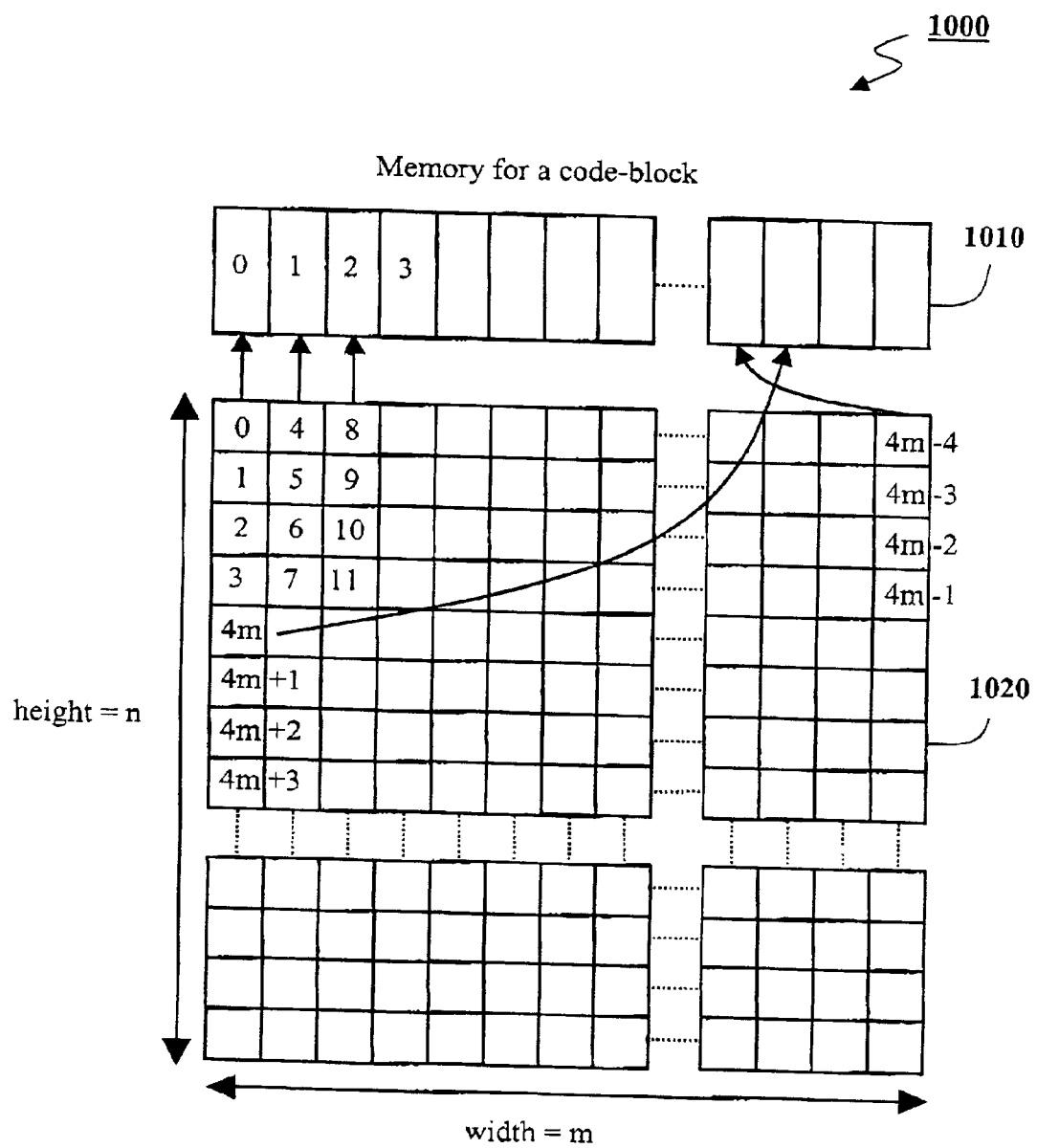
FIG. 10 is a diagram illustrating a memory structure for a code block and the corresponding code-block scan pattern.

In step 514, a ReadPlane (N, sign) process updates the bit-plane coefficient bits and sign bits in the Bit and Sign arrays 310, 320. The memory 1000 of FIG. 10 is structured according to the code-block particular scan-pattern. Starting at the top left, the first 4 coefficients of the first column (rows 0, 1, 2 and 3) are stored in memory location 0. Then the first 4 coefficients of the second column are stored in the next location until the width of the code-block has been reached. Then the second 4 coefficients (4m, 4m+1, 4m+2 and 4m+3) of the first column are stored following the first 4 coefficients (4m−4, 4m−3, 4m−2, 4m−1) in the last column. Given this memory structure, each entry of scan_1 (corresponding to rows 210 of FIG. 2) for the Bit and Sign arrays 310, 320 can be updated in one clock cycle.

The buffering arrays 310–350 are capable of Rotateleft and Rotateup operations. In a Rotateleft operation, the contents in column[x] are moved to column[x−1], where x is in the range of 1 to m−1, and column[0] is moved to column[m−1] in the same clock cycle (see FIG. 2). In a Rotateup operation, the contents of a scans (e.g. 212) are moved to scan_y−1 (e.g. 210), where y is in the range of 2 to n/4, and scan_1 210 is moved to scan_n/4 214 in the same clock cycle.

The variation of a Rotateleft operation on the 5 arrays 310-350 is indicated in Table 1. The extra 2 rows (4 and n−1) performed on SigState and Sign array are to synchronise with rows 0 and 3 for neighbourhood context look-up. When the Sign array is first loaded, the update condition is used. Column 1 is loaded from memory when updated. Otherwise, column 1 is loaded from column 2. The sign array is loaded once for a code block. The bit array is loaded once every bit plane.

The SigState, Coded and MR1st arrays 330, 340, 350 are to be reset before coding starts in a code block. The Coded array 340 also needs to be reset between coding of bit planes.

Once the highest significant bit-plane is coded by the Cleanup process 516, the rest of the bit-planes are coded by a Code1Plane process. In particular, in decision block 518, a check is made to determine if N>0 (indicating bitplanes remain to be processed). If decision block 518 returns false (N), processing terminates in step 520. Otherwise, if decision block 518 returns true (Y), processing continues at step 522. In step 522, the number of significant bitplanes is decremented. In step 524, the Code1Plane (N) process is carried out (see FIG. 6). Processing then continues at decision block 518. The output of each pass is a sequence of bits and their corresponding contexts. These bit and context pairs are written into a FIFO 120 for use by the arithmetic coder 130.

2.2 Code1Plane Procedure

Figure 6:
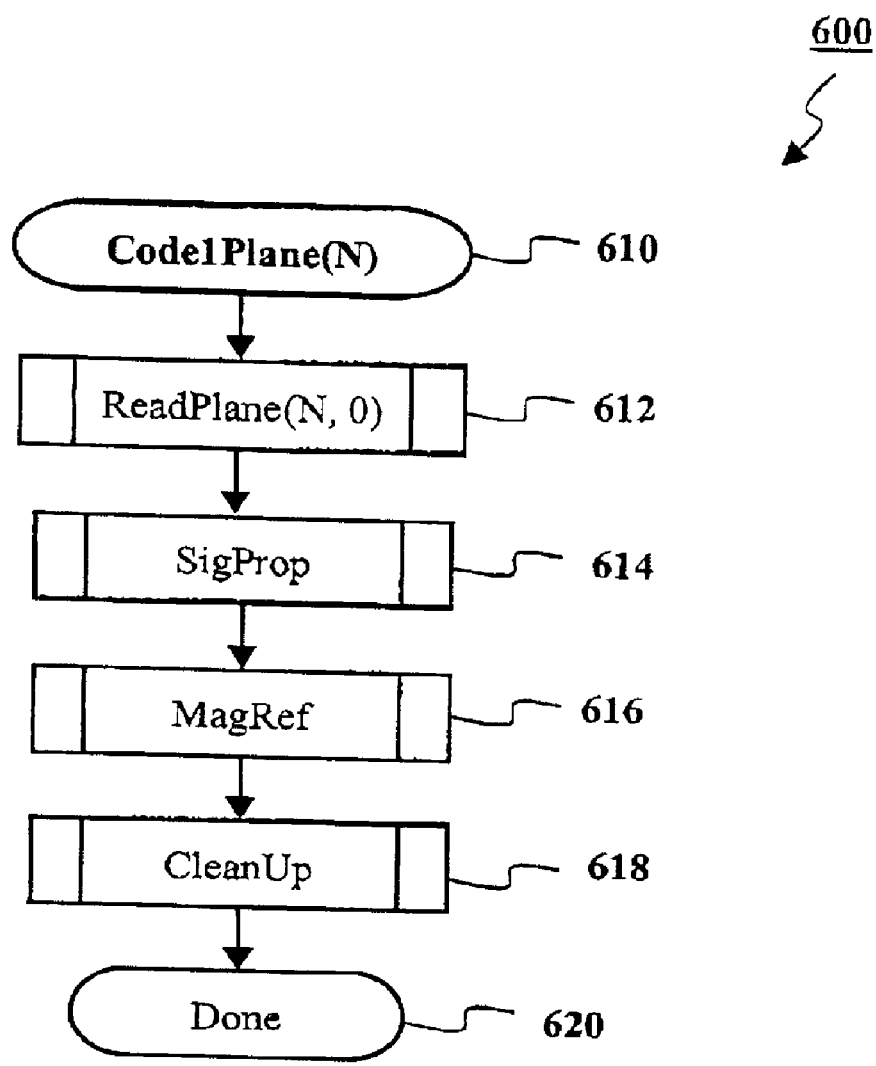
FIG. 6 is a flow diagram illustrating the Code1Plane process for encoding.

The Code1Plane process 600 of FIG. 6 codes each bit-plane using three coding passes Processing commences in step 610. In step 612, the ReadPlane (N, 0) process updates the Bit array 310. The sign array 320 does not need to be updated. Coding can commence as soon as scan_1[0] of Bit array 310 becomes available. Each scan of the Bit array is updated with the bit-plane bits sequentially encoding pattern scan order during one of the coding passes. In step 614 Significance Propagation (SigProp) coding is carried out. In

TABLE 1

| Array Name | Rows Performed On | Data To Column 1 | Data To Other Columns |
|---|---|---|---|
| SigState | SigState[0..4]<br>SigState[n−1] | SigState[0..4][2]<br>SigState[n−1][2] | SigState[0..4][0]<−SigState[0..4][1]<br>SigState[n−1][0]<−SigState[n−1][1]<br>SigState[0..4][m−2..2]<−SigState[0..4][m−1..3]<br>SigState[n−1][m−2..2]<−SigState[n−1][m−1..3]<br>SigState[0..4][m−1]<−SigState[0..4][0]<br>SigState[n−1][m−1]<−SigState[n−1][0] |
| Sign | Sign[n−1]<br>Sign[4]<br>Sign[0..3] | Sign[n−1][2]<br>Sign[4][2]<br>Sign[0..3][1] from Memory (when update)<br>Or<br>Sign[0..3][2] | Sign[0..4][0]<−Sign[0..4][1]<br>Sign[n−1][0]<−Sign[n−1][1]<br>Sign[0..4][m−2..2]<−Sign[0..4][m−1..3]<br>Sign[n−1][m−2..2]<−Sign[n−1][m−1..3]<br>Sign[0..4][m−1]<−Sign[0..4][0]<br>Sign[n−1][m−1]<−Sign[n−1][0] |
| Bit | Bit[0..3] | Memory (when update)<br>Or<br>Bit[0..3][2] | Bit[0..3][0]<−Bit[0..3][1]<br>Bit[0..3][m−2..2]<−Bit[0..3][m−1..3]<br>Bit[0..3][m−1]<−Bit[0..3][0] |
| Coded | Coded[0..3] | Coded[0..3][2] | Coded[0..3][0]<−Coded[0..3][1]<br>Coded[0..3][m−2..2]<−Coded[0..3][m−1..3]<br>Coded[0..3][m−1]<−Coded[0..3][0] |
| MR1st | MR1st [0..3] | MR1st [0..3][2] | MR1st[0..3][0]<−MR1st[0..3][1]<br>MR1st[0..3][m−2..2]<−MR1st[0..3][m−1..3]<br>MR1st[0..3][m−1]<−MR1st[0..3][0] |

SigState [n−2, ... , n−4] are not used in coding. As a result, the RotateLeft operation is not required.

Referring back to FIG. 5, in step 516, the first Cleanup pass process is started as soon as scan_1[0] of the Bit and Sign arrays is available, which is 2 clock cycles later (one cycle to write into scan_1[1] and one cycle to shift to scan_1[0]). ReadPlane (N, sign) step 514 only writes data into scan_[1], and the other entries in these arrays can be filled up with the mechanisms of Rotateleft and Rotateup operations. The entire Bit and Sign arrays 310, 320 are filled with the bit-plane N (already once decremented from its original value) and the corresponding sign bit of each coefficient during the course of the Cleanup pass 516. The Sign array only needs to be filled once for each code-block while the Bit array 310 needs to be filled for each bit-plane.

step 616, magnitude refinement (MagRef) is performed on the bit-plane. Finally, in step 618, a CleanUp pass is performed on the bit-plane to code any remaining bits of coefficients. Processing terminates in step 620. Each of the coding passes of steps 614, 616, 618 is described in greater detail with reference to FIGS. 7, 8, 9, respectively.

2.3 SigProp Procedure

Figure 7:
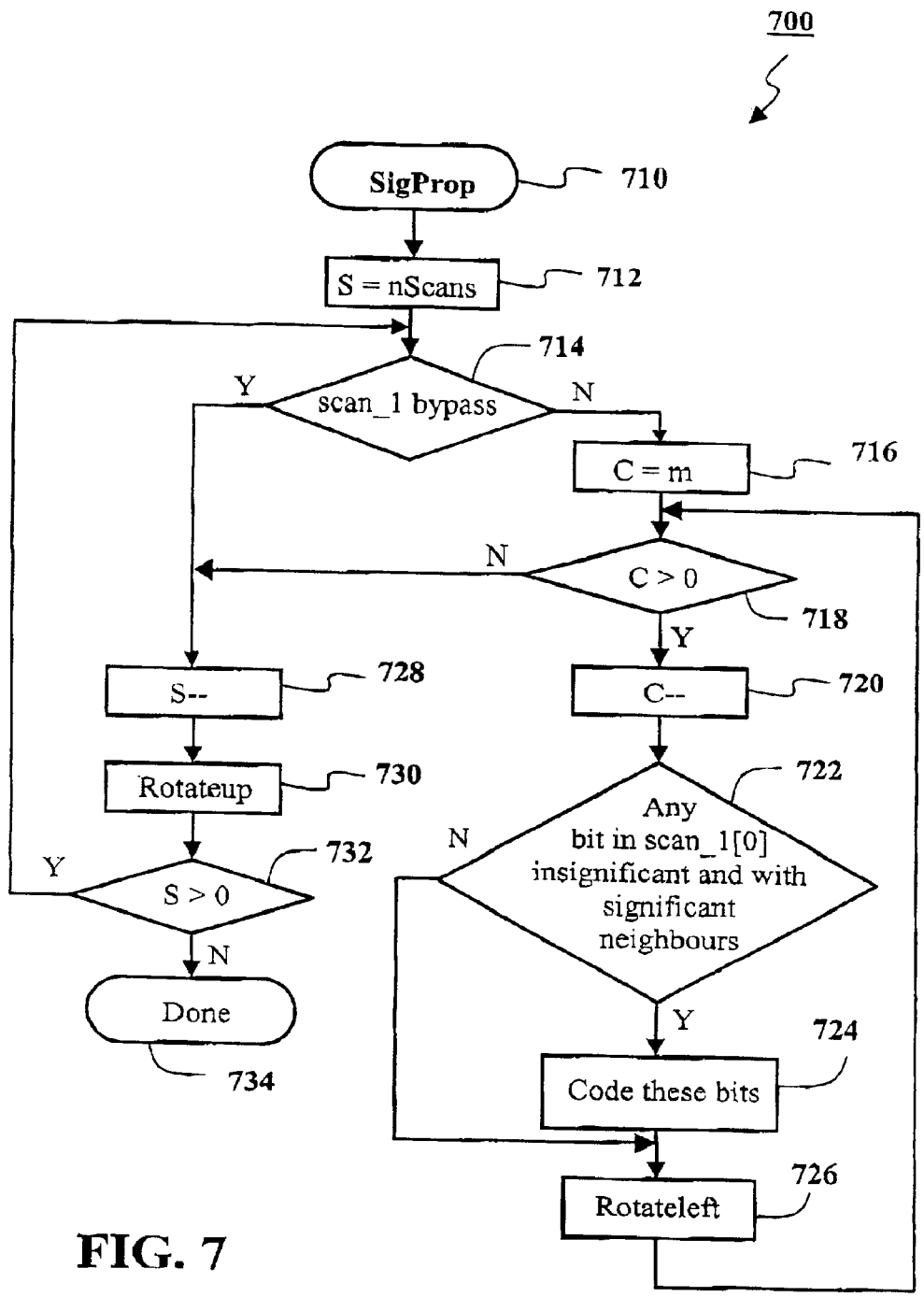
FIG. 7 is a detailed flow diagram illustrating the Significance Propagation (SigProp) process in accordance with the embodiments of the invention.

FIG. 7 is a flow diagram illustrating the Significance Propagation pass 700 (corresponding to step 614 of FIG. 6). Processing commences in step 710. The number of scans to code, S, is first loaded in step 712 with nScans, which equals n/4. In decision block 714, a check is made to determine if scan_1 can be bypassed. The determination of the bypass condition is described hereinafter in section 2.6. If decision block 714 returns false (N) indicating scan_1 cannot be bypassed, processing continues at step 716 which loads column to be m. All columns in scan_1 are then coded.

In decision block 718, a check is made to determine if the column C>0. If decision block 718 returns true (Y), processing continues at step 720. In step 720, the as column number C is decremented. In decision block 722, a check is made to determine if any bit in scan_1[0] is insignificant (corresponding significant state is 0) and at least one of its neighbours is significant. If decision block 722 returns false (N), processing continues at step 726. Otherwise, if decision block 722 returns true (Y), processing continues at step 724. In step 724, the bit is coded. In particular, the bit and its context label are sent to the arithmetic coder (by means of the FIFO 120). All eligible bits coded in step 724 are updated for SigState and coded arrays 330, 340. The corresponding SigState is changed if the bit turns significant and the coded bit is marked. Once all the eligible bits of column C in scan_1[0] are coded or there is no eligible bit, processing continues at step 726. In step 726, a Rotateleft operation takes place, in accordance with Table 1. The bit and sign arrays use the update condition. Processing then continues at decision block 718.

If decision block 714 returns true (Y), processing continues at step 728. Similarly, if decision block 718 returns false (N) indicating that all columns in scan_1 are coded, processing continues at step 728.

In step 728, the number of scans to code S is decremented. In step 730, a Rotateup operation is performed on all five arrays 310–350, and scan_1 becomes the next scan. In decision block 732, a check is made to determine if S>0. If decision block 732 returns false (N), processing terminates in step 734. Otherwise, if decision block 732 returns true (Y) indicating that scans remain to be coded, processing continues at decision block 714. In this manner the process continues on the next scan until all scans are coded.

2.4 MagRef Procedure

Figure 8:
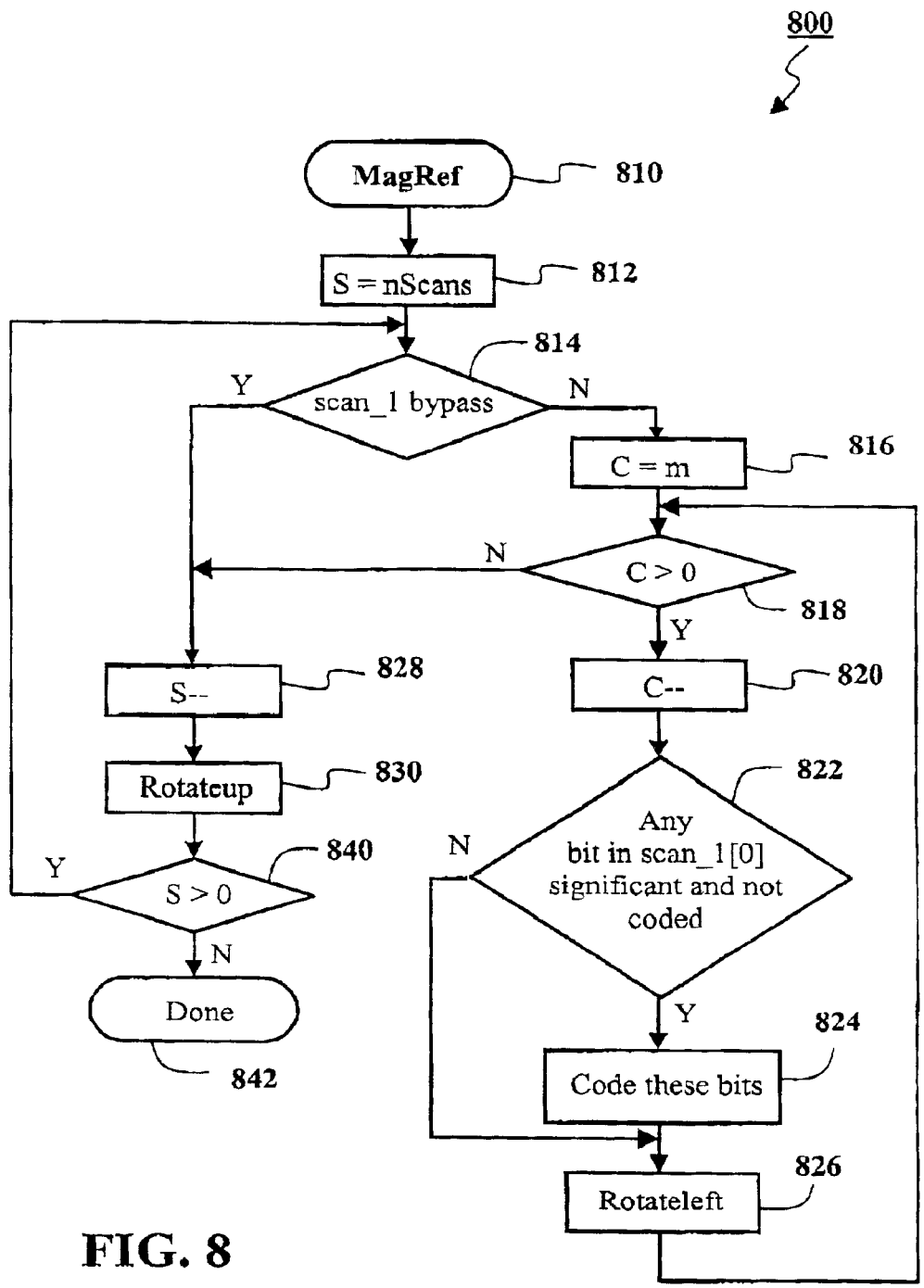
FIG. 8 is a detailed flow diagram illustrating the magnitude refinement process in accordance with the embodiments of the invention.

FIG. 8 is a flow diagram illustrating the magnitude refinement process 800 (corresponding to step 616 of FIG. 6). Processing commences in step 810. In step 812, the number of scans to code S is loaded with the value nScans, which equals n/4. In decision block 814, a check is made to determine if scan_1 can be bypassed. The bypass condition is described hereinafter in section 2.6. If decision block 814 returns false (N) indicating that scan_1 cannot be bypassed, processing continues at step 816. In step 816, the column number C is loaded with the value m. In decision block 818, a check is made to determine if C>0. If decision block 818 returns true (Y) indicating that further columns remain to be processed, processing continues at step 820. In step 820, the column number C is decremented.

In decision block 822, a check is made to determine if any bit and scan_1[0] has a corresponding significant state and was not coded in the Significance Propagation pass in scan_1[0]. If decision block 822 returns false (N), processing continues at step 826. Otherwise, if decision block 822 returns true (Y), processing continues at step 824. In step 824, the bits of scan_1[0] are coded if eligible. Each of the eligible bits and its corresponding context label are sent to the arithmetic coder 130 In step 824, the coded and MR1st arrays 340, 350 are updated accordingly. In step 826, a Rotateleft operation is performed in accordance with Table 1. For column 1 of bit array 310, the input data is from memory if the scan has not been updated; otherwise, the input is from column 2. Processing then continues at decision block 818. In this manner, the process codes through all columns in scan_1.

If decision block 814 returns true (Y), processing continues at step 828. Similarly, if decision block 818 returns false (N), processing continues at step 828. In step 828, the number of scans to code S is decremented. In step 830, a Rotateup operation is performed on all five arrays 310–350, and scan_1 becomes the next scan. In decision block 840, a check is made to determine if S>0. If decision block 840 returns false (N), processing is terminated in step 842. Otherwise, if decision block 840 returns true (Y), processing continues at step 814. In this manner, the magnitude refinement coding process continues on the next scan until all scans have been coded.

2.5 Cleanup Procedure

Figure 9:
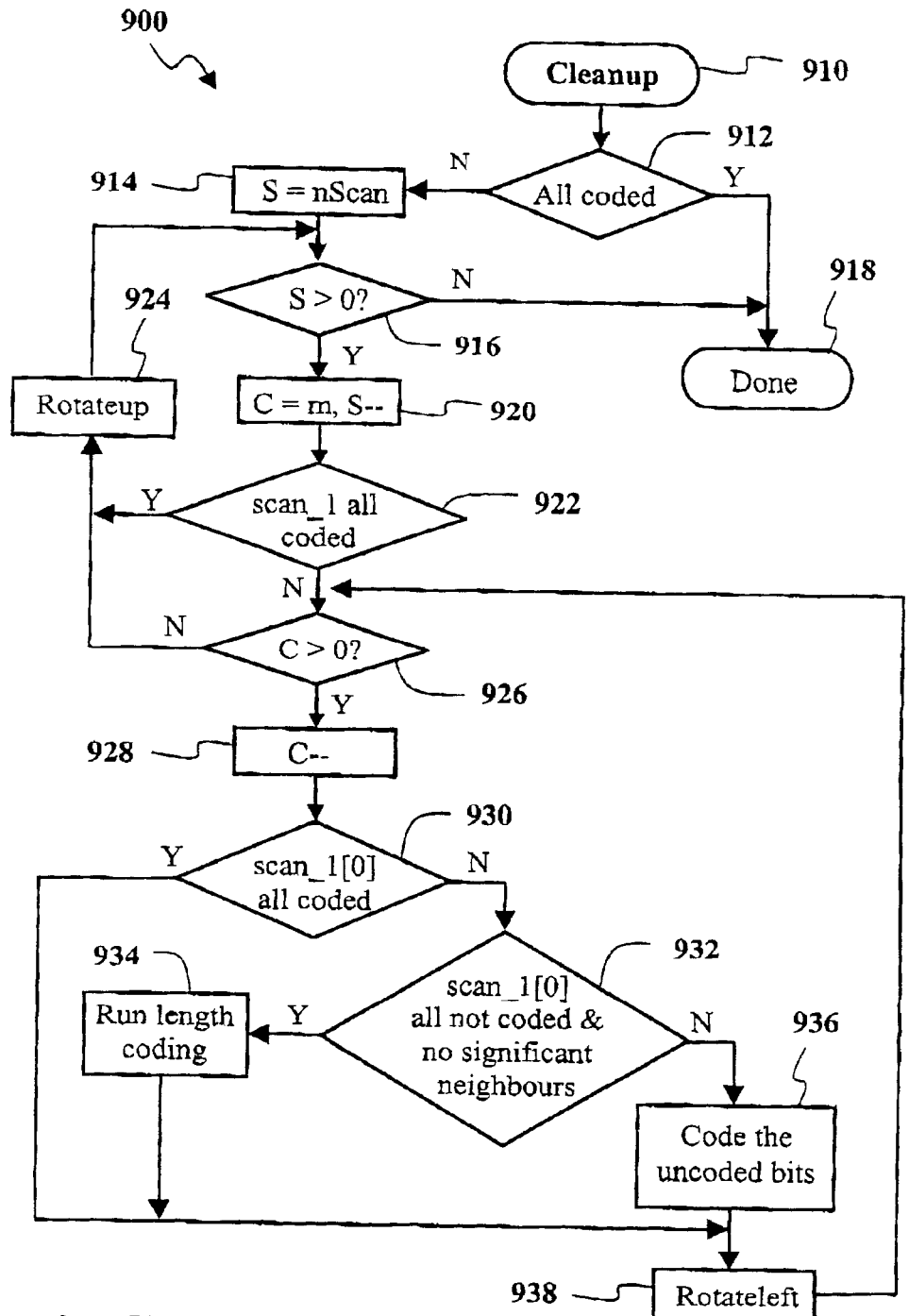
FIG. 9 is a detailed flow diagram illustrating the cleanup pass process in accordance with the embodiments of the invention.

Cleanup pass 900 of FIG. 9 codes the remaining uncoded bits in each bit-plane after the significance propagation and magnitude refinement passes. Because there is nothing to be coded by the significance propagation and magnitude refinement passes in the most significant bit-plane, this bit plane is coded with Cleanup pass 900 only.

FIG. 9 is a flow diagram illustrating the cleanup pass process 900. Processing commences in step 910. In step 912, a check is made to determine if the whole bit plane has been coded. If decision block 912 returns true (Y), processing terminates at step 918. Otherwise, if decision block 912 returns false (N), processing continues at step 914. In step 914, the number of scans to code S is loaded with the value nScan, which is equal to n/4. In decision block 916, a check is made to determine if S>0. If decision block 916 returns false (N), processing terminates in step 918. Otherwise, if decision block 916 returns true (Y), processing continues at step 920.

In step 920, the column number C is set equal to m and the number of scans S is decremented. In decision block 922, a check is made to determine if all bits in scan_1 have been coded. If decision block 922 returns true (Y), processing continues at step 924. In step 924, a Rotateup operation is performed to rotate to the next scan. With reference to step 924, once all columns in scan_1 have been coded, the Rotateup operation is performed on all rive arrays, and scan_1 becomes the next scan. Processing then continues at decision block 916.

Otherwise, if decision block 922 returns false (N), processing continues at decision block 926. In decision block 926, a check is made to determine if C>0. If decision block 926 returns false (N), processing continues at decision block 924. Otherwise, if decision block 926 returns true (Y), processing continues at step 928.

In step 928, the column number C is decremented. In decision block 930, a check is made to determine if all bins of scan_1[0] have been coded. If decision block 930 returns true (Y), processing continues at step 938. Otherwise, if decision block 930 returns false (N), processing continues at decision block 932.

In decision block 932, a check is made to determine if all bits in scan_1[0] are not coded and have insignificant neighbours. If decision block 932 returns true (Y), processing continues in step 934. In step 934, run length coding is applied to the four bits, before processing continues at step 938. Otherwise, if decision block 932 returns false (N), processing continues at step 936. In step 936, the rest of the bits in scan_1[0] are coded.

In step 938, a Rotateleft operation is applied to scan_1, and processing then continues at decision block 926. The same process continues on the next scan until all scans have been coded.

2.6 Speed Up

As the Rotateleft and Rotateup operations each take one clock cycle to finish, these operations are overhead when there are no eligible bits in a particular pass. The overhead becomes quite significant when there are only a few bits to code in a particular pass. For example, when there is only one bit to code in the xth column of scan_3, m*2(Rotateleft for scan_1 and scan_2)+2(Rotateup)+x(Rotateleft for scan_3) clock cycles are required to reach the bit to be coded. After this bit is coded, another m*(n/4−3)+(n/4−2) clock cycles are required to get the arrays ready for next pass.

Figure 4:
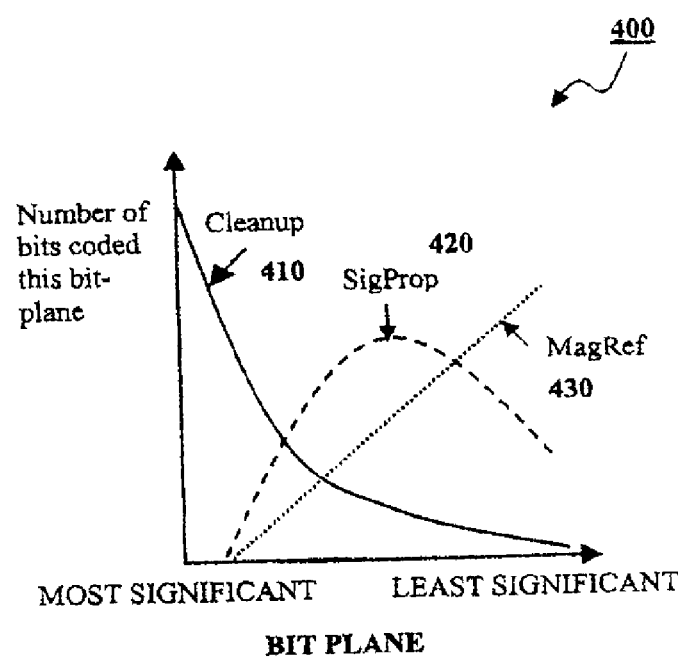
FIG. 4 is a graph plotting the number of bits coded in each pass for each bit plane.

FIG. 4 is a graph illustrating the average trend 410, 420, 430 of number of bits coded in each of the cleanup, Significance Propagation, and magnitude refinement passes from the most significant bit-plane to the least significant bit-plane. As the number of coded bits in a particular pass drops, the overhead for a Rotateleft operation becomes significant.

Speed up can be obtained by checking each coding pass. In the Significance Propagation pass, all bits in scan_1 are checked for if either no significant neighbours exist or the bits to be coded are all significant (see decision block 714 of FIG. 7). If the checking condition is true, a Rotateup operation can be carried out and the next scan started without coding any bits. That is, a bypass is carried out.

In the Magnitude Refinement pass, a check is made to determine if there are any bits in scan_1 which are significant and not coded (see decision block 814 of FIG. 8). If the checked-for condition is true, a Rotateup operation is carried out and next scan started without coding any bits.

In the Cleanup pass 900, a check is made to determine if all bits are coded (see decision block 912). If so, this pass is bypassed. Otherwise, the Cleanup pass process 900 checks if all bits in scan_1 are coded (see decision block 922). If so, a Rotateup operation to the next scan is carried out.

In the case of bypassing a scan in a particular pass for speed up, the update of the Bit array 310 for the current bit-plane on that scan is also omitted. The update is carried out on the next pass performed on this scan. For example, if Significance Propagation pass 700 is bypassed on scan_1, the update of Bit array 310 on scan_1 takes place in the Magnitude Refinement pass 800 if the latter pass is not to be bypassed. Otherwise, the update takes place in the Cleanup pass 900.

There is an update status bit for each scan in the Bit array. Each scan in the Bit array has an extra update status bit (not shown in the drawings). These status bits are reset before coding on a bit-plane, and the Coded array is reset. Both the SigState and the MR1st arrays 330, 350 are reset before coding a code-block. The states of these arrays 330, 350 are maintained through the coding between bit-planes.

The scheme for bypassing a particular pass can be further refined to a smaller resolution to gain more speed. For example, a scan can be divided into a few sections and a check for the specific bypass condition for each pass can be done on each section separately. A RotateLeft operation can then be applied to Scan_1 and the whole section is bypassed for a specific pass instead or a whole scan.

2.7 Special Speed-up for the 1st Cleanup Pass

Further speed-up can be achieved from the $1^{st}$ cleanup pass in accordance with the embodiments of the invention since most of the bits in the most significant bit plane are coded with RUN LENGTH 4 context. The speed-up is accomplished with pre-collected statistics of coefficients during the sign-magnitude transform process, as described hereinafter. The statistics for a portion of a scan can be read and a decision, that if this portion can be all coded with RUN LENGTH 4 context, can be made, saving the time needed to read bit plane data of each column in this portion. The collected statistics information of coefficients in a code block are stored together with the coefficients. Before reading out the bit plane data for a portion of a code block, the statistics are read first and used to analyse if this portion needs to be coded with another context, rather than RUN LENGTH 4. If the test shows that every column in this portion can be coded with RUN LENGTH 4, a special "RUN LENGTH 4 repeat" command is sent by the context generator 110 via the FIFO 120 to the arithmetic coder 130. The context generator can then advance to the next portion.

The statistics of coefficients indicate if a portion of bits turns significant after the $1^{st}$ cleanup pass. Preferably, a 32×32 code block is used with a portion covering a quarter of a scan as an example for collecting the statistics information. First, each portion is scanned through and the maximum magnitude of that portion is found and stored. As each portion is scanned, the maximum magnitude of the code block also can be found. Table 2 shows a resulting array of maximum magnitude for each portion.

TABLE 2

| 3 | 2 | 4 | 4 |   | 0 | 0 | 1 | 1 |
|---|---|---|---|---|---|---|---|---|
| 6 | 3 | 2 | 4 |   | 1 | 0 | 0 | 1 |
| 4 | 2 | 2 | 2 |   | 1 | 0 | 0 | 0 |
| 2 | 1 | 2 | 4 |   | 0 | 0 | 0 | 1 |
| 2 | 1 | 2 | 2 |   | 0 | 0 | 0 | 0 |
| 2 | 2 | 2 | 4 |   | 0 | 0 | 0 | 1 |
| 2 | 2 | 2 | 4 |   | 0 | 0 | 0 | 1 |
| 2 | 2 | 2 | 2 |   | 0 | 0 | 0 | 0 |

The second (right) grid is the statistics for the code block.

The maximum magnitude of the code block (on the left hand side of Table 2) is 6. The maximum magnitude has 3 significant bit planes. Each maximum magnitude in this array is then right shifted 2 bits. The array becomes the array shown on the right hand side of Table 2. The 1 bit statistics can then be stored together with the sign magnitude transformed coefficients and used for the $1^{st}$ cleanup speed up.

Before starting the $1^{st}$ cleanup pass on a code block, the statistics can be read to decide if a portion can be coded entirely with RUN LENGTH 4 context. The decision is made based on the pseudo code of Table 3.

TABLE 3

```
subblockwidth = code_block_width/4;
c = current column index at the start of each subblock;
column = c/subblockwidth;
p1 = 0, p2 = 0, p3 = 0, p4 = 0;
if (scan > 0)
{
    //check the SigState on top neighbour of "X" region
    for (int i = 0; i < subblockwidth; i++)
        if (SigState[BlockHeight-1][i])
            p2 = 1;
    if(column < 3)
        //check the SigState on the top right neighbour of "X"
        p3 = SigState[BlockHeight-1][c+subblockwidth];
}
if (column > 0)
//check the SigState on the left neighbour of "X"
p4 = SigState[0][c-1] | SigState[1][c-1] | SigState[2][c-1] |
   SigState[3][c-1];
```

TABLE 3-continued

```
if (column > 0 && scan > 0)
    //check the SigState on the top, left neighbour of "X"
    p1 = SigState[BlockHeight-1][c-1];
//If any of the regions that have been checked is significant
if(SigMatrix[scan][column]= =1 || p1 = =1 || p2 = =1 ||
p3 = =1 || p4 = =1)
    do normal cleanup pass;
else
send "runlength4 repeat subblockwidth" to Fifo;
```

Regions P1, P2, P3 and P4 are the top left, top, top right and left region neighbours of a region "X", respectively.

The statistics are first read into the SigMatrix array, which is the array for holding the statistics read from memory. For each portion (subblock), there are 4 neighbour subblocks to consider. Location 1 represents the neighbour subblock on the top left corner. Location 2 represents the neighbour subblock on the top. Location 3 represents the neighbour subblock on the top right corner. Location 4 represents the neighbour subblock on the left. p1, p2, p3 and p4 represent the test results from each location, respectively.

3. Context Generation—Memory and Register Window Based Method

Figure 11:
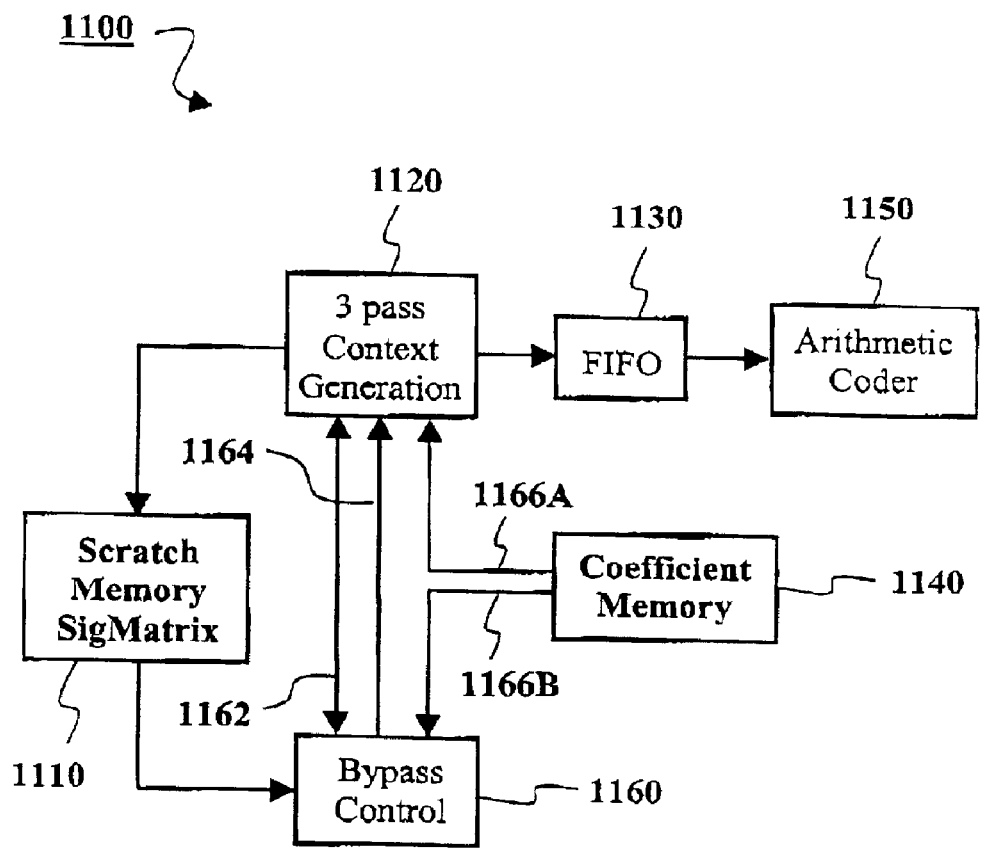
FIG. 11 is a block diagram illustrating an entropy coding device utilising memory and a register window in accordance with another embodiment of the invention.

The register array based method described with reference to FIGS. 1–10 can be implemented in a mixed structure containing memory and with register windows in sit accordance with a second embodiment of the invention shown in FIG. 11.

The mixed structure 1100 includes a 3 pass context generation module 1120, a FIFO 1130, and an arithmetic coder 1150, all of which correspond to the modules 110, 120, and 130 of FIG. 1, respectively. Further, the mixed structure 1100 includes a scratch memory and SigMatrix 1110, a bypass control module 1160, and coefficient memory 1140. The context generation module 1120 provides output to FIFO 1130, which in turn is coupled to arithmetic coder 1150. The 3 pass context generation module 1120 also provides an output to the scratch memory and SigMatrix module 1110. The scratch memory and Sigmatrix module 1110 provides output to the bypass control module 1160. The bypass control module 1160 has a bi-directional control bus 1162 coupled with the context generation module. The module 1160 also has a unidirectional data bus 1164 coupled with the context generation module 1120 and a unidirectional data bus 1166B from the uni-directional coefficient memory 1140. The coefficient memory 1140 is also unidirectionally coupled to the context generation module 1120 by uni-directional bus 1166A.

The coefficient memory module 1140 has the same structure as the coefficient memory 1000 shown in FIG. 10, in the register-array-based method. The coefficients are pre-analysed in the fashion described in Section 2.7, and the statistics are stored together along with the coefficients in the coefficient memory 1140. Instead of caching the whole SigState, Coded and MR1st bit planes in register arrays, a small register-window for each is used to cache the region being coded, while the other regions that are not being coded are kept in the scratch memory. Preferably, a region is confined to 8 columns in a scan. After the context of one of the 3 passes for a particular region is generated, the updated state of SigState, Coded and MR1st bits is written back to the scratch memory 1110. The corresponding SigMatrix bit is also updated with the result of ORing all the bits of SigState in a region, on the write back to the ScratchMem module. Each entry of the scratch memory 1110 holds the state of SigState, Coded and MR1st data for a region. A 2-port (1R/1W) memory is preferably used as the scratch memory 1110 to improve efficiency.

The context generator has 2 main modules: 3 pass context generation (CG) module 1120 and the bypass control (BC) module 1130. These two modules 1120, 1130 share the same coefficient memory (CoefMem) 1140 and scratch memory (ScratchMem) 1110. The 3-pass context generation module 1120 generates the context of a specific region for any of the three noted passes. The bypass control module 1160 looks for the location of the next region to be coded after the currently active region in any of the three passes.

The CG and BC modules 1120, 1160 work in parallel and communicate with each other. When the CG module 1120 finishes the context generation for the current region of any one of the 3 passes, the module 1120 signals the BC module 1160 that the CG module 1120 is ready to accept the next region location and data. The BC module 1160 looks for the next region for the current pass and holds the location information and data until the CG module 1120 grabs the location information and data.

Figure 12:
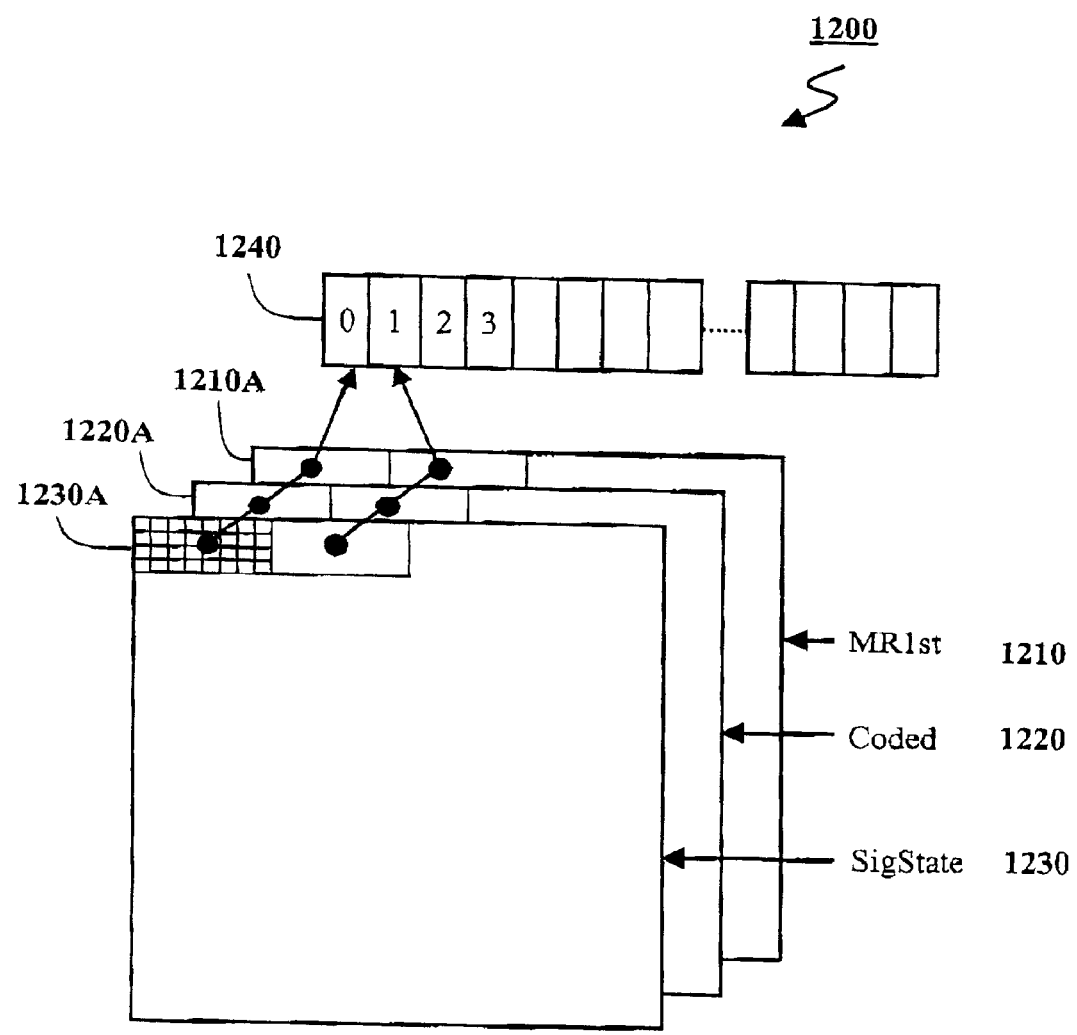
FIG. 12 is a diagram illustrating a scratch memory for storing significance state, coded, and magnitude refinement (MR1st) data.

FIG. 12 is a block diagram of a scratch memory 1200 for the SigState, Coded, and MR1st regions 1230, 1220, 1210, respectively. The diagram illustrates the inter-relationships of the three regions 1210, 1220, and 1230. For example, the three regions of bits 1210A, 1220A, 1230A of the three array regions 1210, 1220, 1230 are stored in column 0 of the memory structure 1240. The arrays 1210, 1220, 1230 are "conceptual" arrays. The data is in fact stored in the scratch memory 1110 in the order shown in FIG. 12.

3.1 BC and CG Interface

The BC and CG modules 1120, 1160 communicate through a control bus 1162 and a data bus 1164. The BC module 1160 looks for the next region to be coded in the current pass, and also indicates which column is the first column to be coded in that region. From the CG module's perspective, Table 4 lists the signals and their functions of BC and CG interface,

TABLE 4

| Signal Name | I/O | Function |
| --- | --- | --- |
| Pass | I | 0:$1^{st}$ cleanup; 1:SP; 2:MP; 3: non $1^{st}$ cleanup |
| Bitplane | I | The to be coded bit plane number. |
| RL4_rdy | I | The current region can be all coded with Run Length 4 context when in the $1^{st}$ cleanup pass. |
| Region_no | I | The next region to be coded in the current pass. Region number starts with 0 on the top left corner and increases in raster scan order. A region has 8 columns. |
| Column_no | I | The starting column to be coded in the next region. |
| Valid | I | The command from BC is valid. |

TABLE 4-continued

| Signal Name | I/O | Function |
| --- | --- | --- |
| Ready | O | CG is ready to accept the next command. |
| Data | I | SigState, Coded and MR1st |

3.2 Encoding Process

Figure 13:
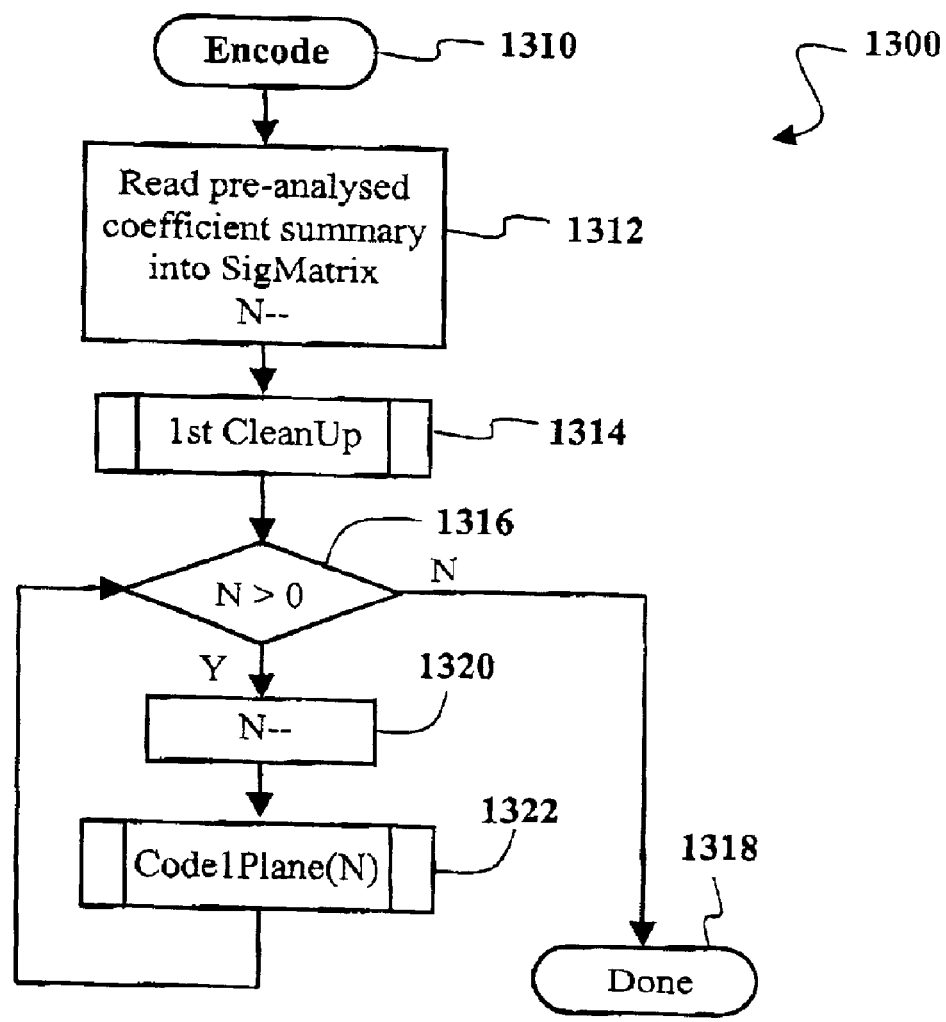
FIG. 13 is a flow diagram illustrating the encoding process in accordance with an embodiment of the invention.

FIG. 13 is a flow diagram illustrating an encoding procedure 1300 in accordance with an embodiment of the invention. Processing commences in step 1310. In step 1312, a pre-analysed coefficient summary is read into the SigMatrix 1110, and the number of significant bit planes N is decremented. The coefficient analysis in the sign magnitude process as described in Section 2.7 is utilised. The analysed summary of coefficients is read into the SigMatrix before the 1$^{st}$ cleanup pass, In step 1314, the 1$^{st}$ cleanup pass is performed.

In decision block 1316, a check is made to determine if N>0. If decision block 1316 returns false (N), processing terminates at step 1318. If decision block 1316 returns true (Y), processing continues at step 1320. In step 1320, the number of significant bit planes N is decremented. In step 1322, the Code1Plane (N) is applied to the bit plane before processing continues at decision block 1316. In this manner, the remaining bit planes are coded by the Code1Plane process.

3.3 Code1Plane Procedure

With reference to step 1322 of FIG. 13, the Code1Plane process 600 of FIG. 6 codes the remaining non-top bit planes in order. Each bit in a plane is coded in one of the 3 passes. The BC and CG modules 1160, 1120 work in parallel in each pass. The BC module 1160 is always ahead of the CG module 1120 at least by one region in each pass. The CG module 1120 may generate context in the cleanup pass for the bitplane n while the BC module 1160 is looking for the next region in the Significance Propagation pass for bitplane n−1. The following sections list the processes for both the BC and CG modules 1160, 1120 in each pass.

3.4 BC Module 3.4.1 1$^{st}$ Cleanup Pass

Figure 14:
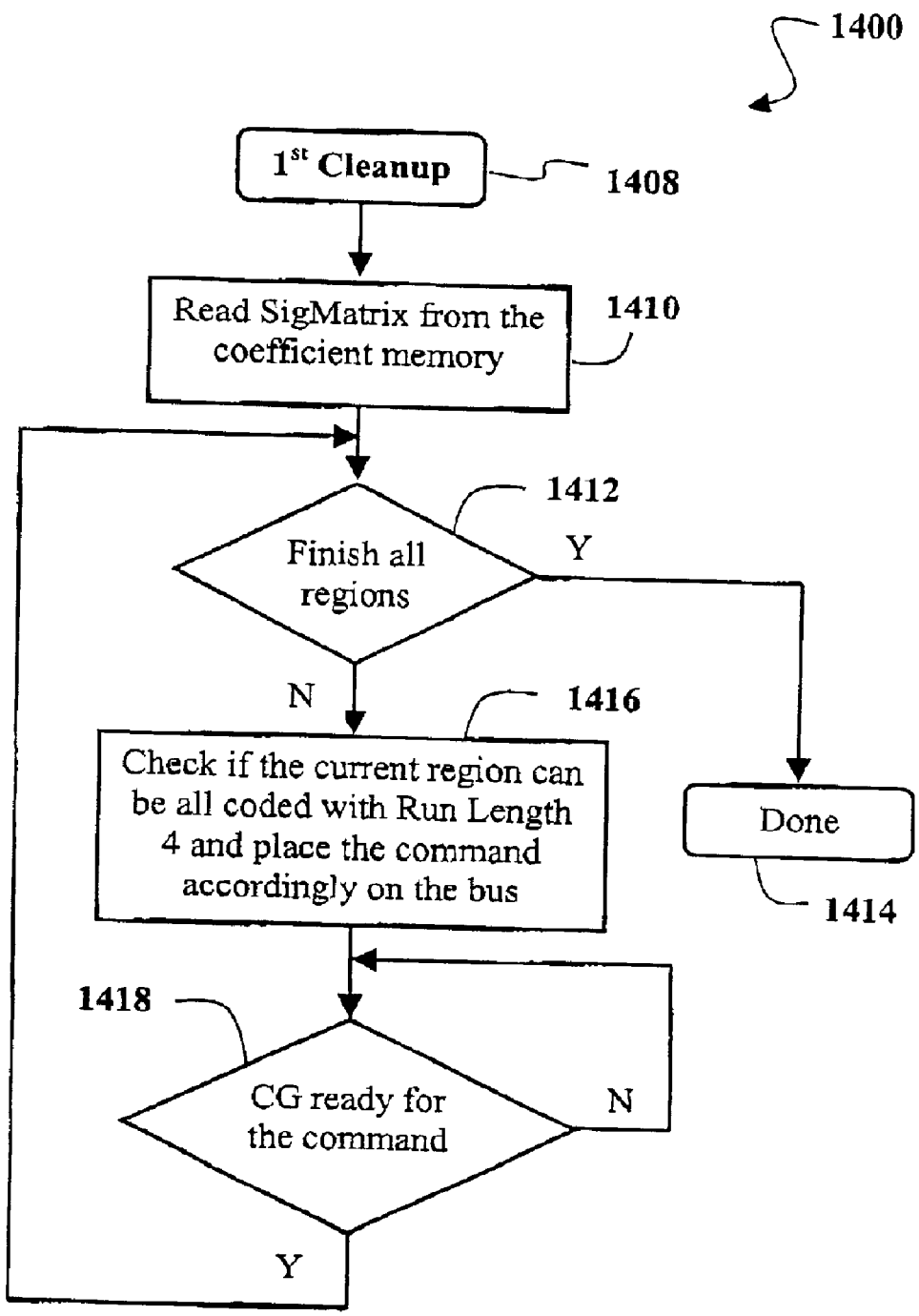
FIG. 14 is a flow diagram illustrating the first cleanup pass for a bypass control module.

FIG. 14 is a flow diagram illustrating the 1$^{st}$ cleanup pass process 1400 for the BC module 1160. Processing commences in step 1408. In step 1410, the SigMatrix is read from the coefficient memory 1140. In step 1412 a check is made to determine if all of the regions have been finished or processed. If decision block 1412 returns true (Y), processing terminates in step 1414. Otherwise, if decision block 1412 returns false (N), processing continues in step 1416.

In step 1416, a check is made to determine if the current region can be coded entirely with run length for encoding and, if so, places the command accordingly on the bus. Processing then continues at decision block 1418. In decision block 1418, a check is made to determine if the CG module 1120 is ready for the command. If decision block 1418 returns false (N), processing continues at decision block 1418. Otherwise, if decision block 1418 returns true (Y), processing continues at decision block 1412.

In this manner, the BC module 1160 scans each region in roster order from the top left corner and checks if the current region can be coded with the special run length for repeat command. When the checking is done, the BC module 1160 places the command on the bus and signals the CG module 1120. The BC module 1160 then waits until the CG module 1120 grabs the command for checking the next region.

Preferably, a small buffer can be placed between the BC and CG interface to prevent the CG module 1120 from holding up the BC module 1160.

The checking mechanism is similar to the one used in the register array based method, while a bit more complicated to eliminate unnecessary reads to the scratch or coefficient memory 1110, 1140, which could cause delays.

Figure 15A:
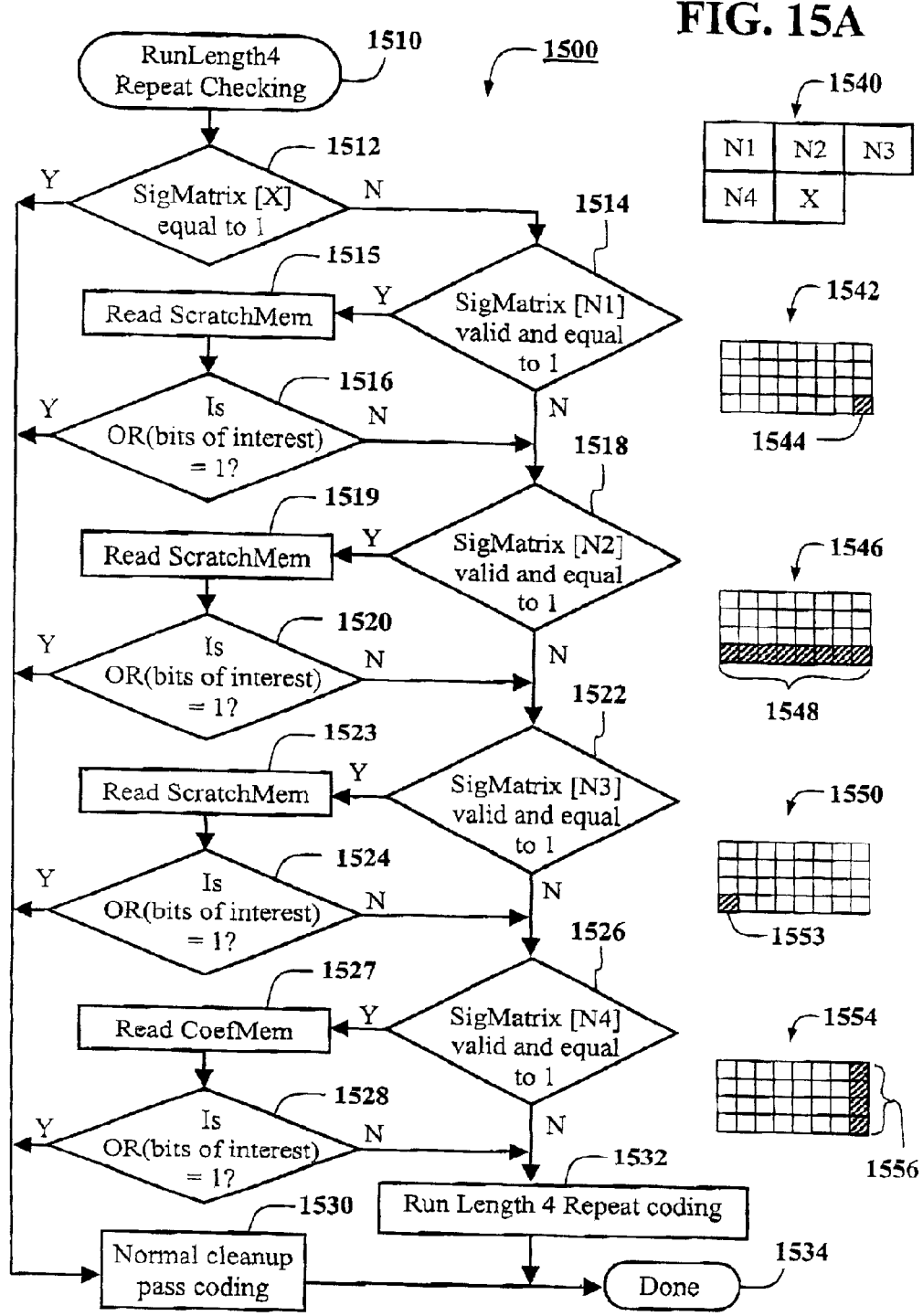
FIGS. 15A and 15B are a detailed flow diagram illustrating a special ran length coding checking process in accordance with an embodiment of the invention and a related 4×4 Sigmatrix.

FIG. 15A is a flow diagram illustrating the run-length-coding checking process 1500. Beside certain steps of the process 1500 are shown regions that are being processed. In step 1510, processing commences. In decision block 1512 SigMatrix [X] is equal to 1. Beside decision block 1512 is shown the current region being checked that is labelled X and four neighbour regions N1, N2, N3 and N4 1540. These four regions are apart from the region being checked. Each of the neighbour regions has bits of interest in that region, which are shaded. If decision block 1512 returns true (Y), processing continues at step 1530. In step 1530, a normal cleanup pass coding is performed Processing then terminates in step 1534.

Only those bits of interest are checked when the content of SigState array 330 is read from the scratch memory module 1110. Before proceeding with a read into the scratch memory module 1110 to update the SigState for a region, in each decision block 1516, 1520 and 1524, the corresponding bit(s) in SigMatrix is checked to avoid an unnecessary read. In decision block 1528, checking of the SigState array 330 for region N4 is read into the coefficient memory 1140 instead of the scratch memory 1110, as the neighbour region N4 is coded by the CG module 1120 and the SigState array 330 in the scratch memory 1110 is not up to date. This process of FIG. 15A is described in greater detail.

Figure 15B:

If decision block 1512 returns false (N), processing continues at decision block 1514. In decision block 1514, a check is made to determine if SigMatrix [N1] is valid and equal to 1. The SigMatrix is valid if the SigMatrix exists in the current checking location. One bit in the SigMatrix represents a 8×4 region. Each region is 8×4. There is a 4×4 SigMatrix 1570 shown in FIG. 15B corresponding to this code block. When checking region 1 for example of 1570, SigMatrix [N1][N2][N3][N4] of 1540 does not exist. When checking region 5 of 1570, SigMatrix [N1][N4] also does not exist. Thus, for a number of regions of 1570 (e.g. 1–4, 5, 9, 13), one or more neighbour regions of 1540 may not be available If decision block 1514 returns false (N), processing continues at decision block 1518. Otherwise, if decision block 1514 returns true (Y), processing continues at step 1515. In step 1515, the ScratchMem is read. In decision block 1516, a check is made to determine if the OR operation of (bits of interest) is equal to 1. If decision block 1516 returns true (Y), processing continues at step 1530. Otherwise, if decision block 1516 returns false (N), processing continues at decision block 1518.

In decision block 1518, a check is made to determine if the SigMatrix [N2] is valid and equal to 1. Again, the SigMatrix N2) is valid if it exists at the current checking location. Bits of interest in each region are fixed. The row 1548 of region 1546 is of interest. If decision block 1518 returns false (N), processing continues at decision block 1522. Otherwise, if decision block 1518 returns true (Y), processing continues at step 1519. In step 1519, the ScratchMem is read. In decision block 1520, a check is made to determine if OR operation of (bits of interest) is equal to 1. If decision block 1520 returns true (Y), processing continues at step 1530. Otherwise, if decision block 1520 returns false (N), processing continues at decision block 1522.

In decision block 1522, a check is made to determine if SigMatrix [N3] is valid and equal to 1 The region 1550 has a bit of interest 1552. If decision block 1522 returns false (N), processing continues at decision block 1526. Otherwise, if decision block 1522 returns true (Y), processing continues at step 1523. In step 1523, the ScratchMem is read In decision block 1524, a check is made to determine if OR (bits of interest) is equal to 1. If decision block 1524 returns true (Y), processing continues at step 1530. Otherwise, if decision block 1524 returns false (N), processing continues at decision block 1526.

In decision block 1526, a check is made to determine if SigMatrix [N4] is valid and equal to 1. For example, the last column 1556 is of interest in region 1554. If decision block 1526 returns false (N), processing continues at step 1532. Otherwise, if decision block 3526 returns true (Y), processing continues at step 1527. In step 1527, the Coef Mem is read. In decision block 1528, a check is made to determine if OR operation of (bits of interest) is equal to 1. If decision block 1528 returns true (Y), processing continues at step 1530. Otherwise, if decision block 1528 returns false (N), processing continues at step 1532. In step 1532, run length 4 repeat coding is performed. Processing then terminates in step 1534.

3.4.2 Significance Propagation Pass

Figure 16:
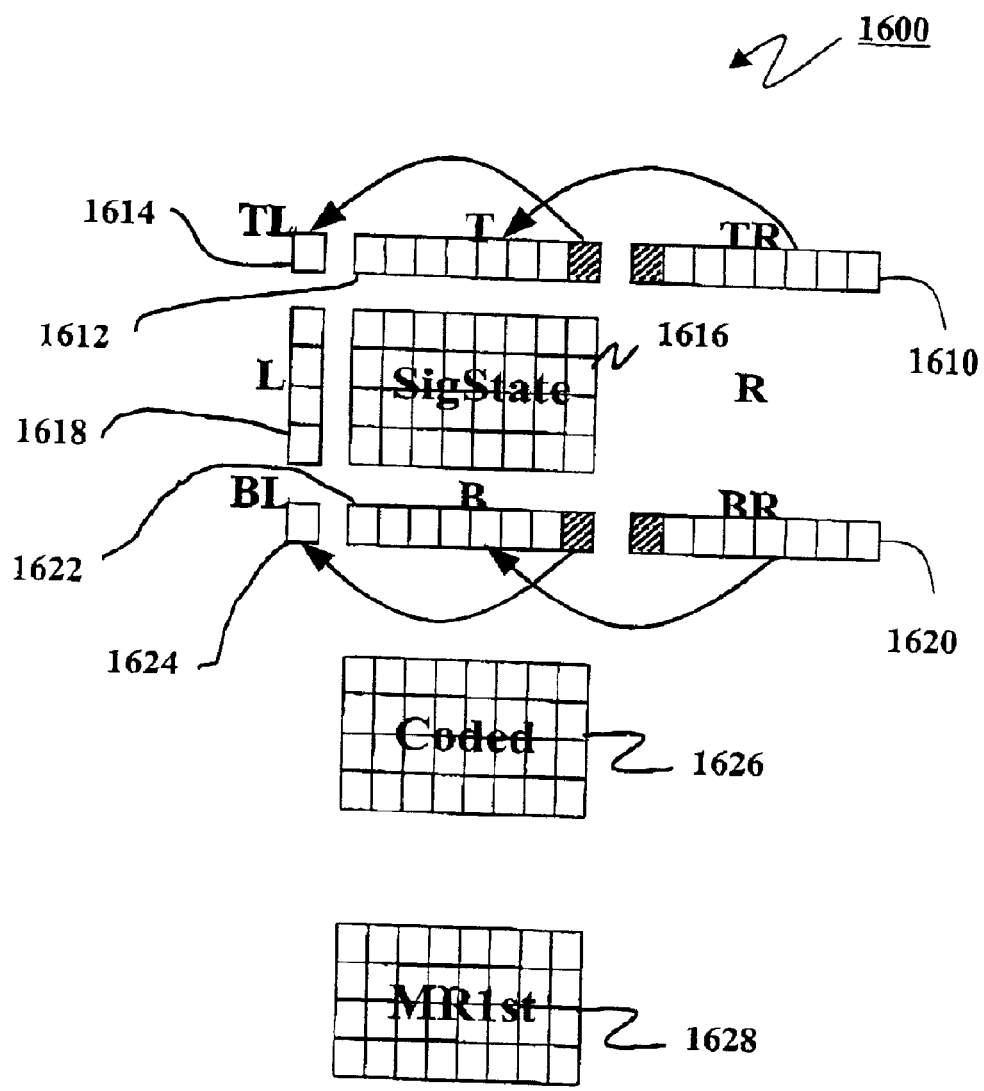
FIG. 16 is a schematic diagram illustrating a register buffer of the bypass control module in accordance with the embodiments of the invention.

With reference to FIG. 16, the register buffers 1600 of the BC module 1160 are shown. When the BC module 1160 finishes the $1^{st}$ Cleanup pass, the BC module 1160 immediately starts to look for the next region that needs to be coded in the Significance Propagation pass, if there are any remaining bitplanes. There are three register groups, which buffer the SigState 1616, Coded 1626 and MR1st 1628 regions read from the ScratchMem module 1110 for a region being tested. For each region being tested, there are 8 neighbour regions having a SigState that needs to be checked. Neighbour regions top-left (TL) 1614, top (T) 1612, top-right (TR) 1610, left (L) 1618, bottom-left (BL) 1624, bottom (B) 1622, and bottom-right (BR) 1620 are buffered in registers, while right (R) region is read directly from the ScratchMem module 1110.

A read into the ScratchMem module 1110 to retrieve the SigState 1616 of that region is only needed when the corresponding SigMatrix bit is 1. The read starts from the $1^{st}$ region having a SigMatrix bit that is "1" or a SigMatrix bit that is equal to "1" in the neighbour region. If any neighbour region does not exist, the corresponding buffer is set to zero. After a region is tested, if the next region is on the right hand side of the current region, each buffered neighbour region is shifted to the left, eg. TR to T, BR to B, T to TL and B to BL (see arrows shown in FIG. 16). If there is any bit in this region that needs to be coded in the Significance Propagation pass, the BC module 1160 signals the CG module 1120 by placing the region number and the column number on the control bus. Otherwise, the BC module 1160 moves on to the next region.

Figure 17:
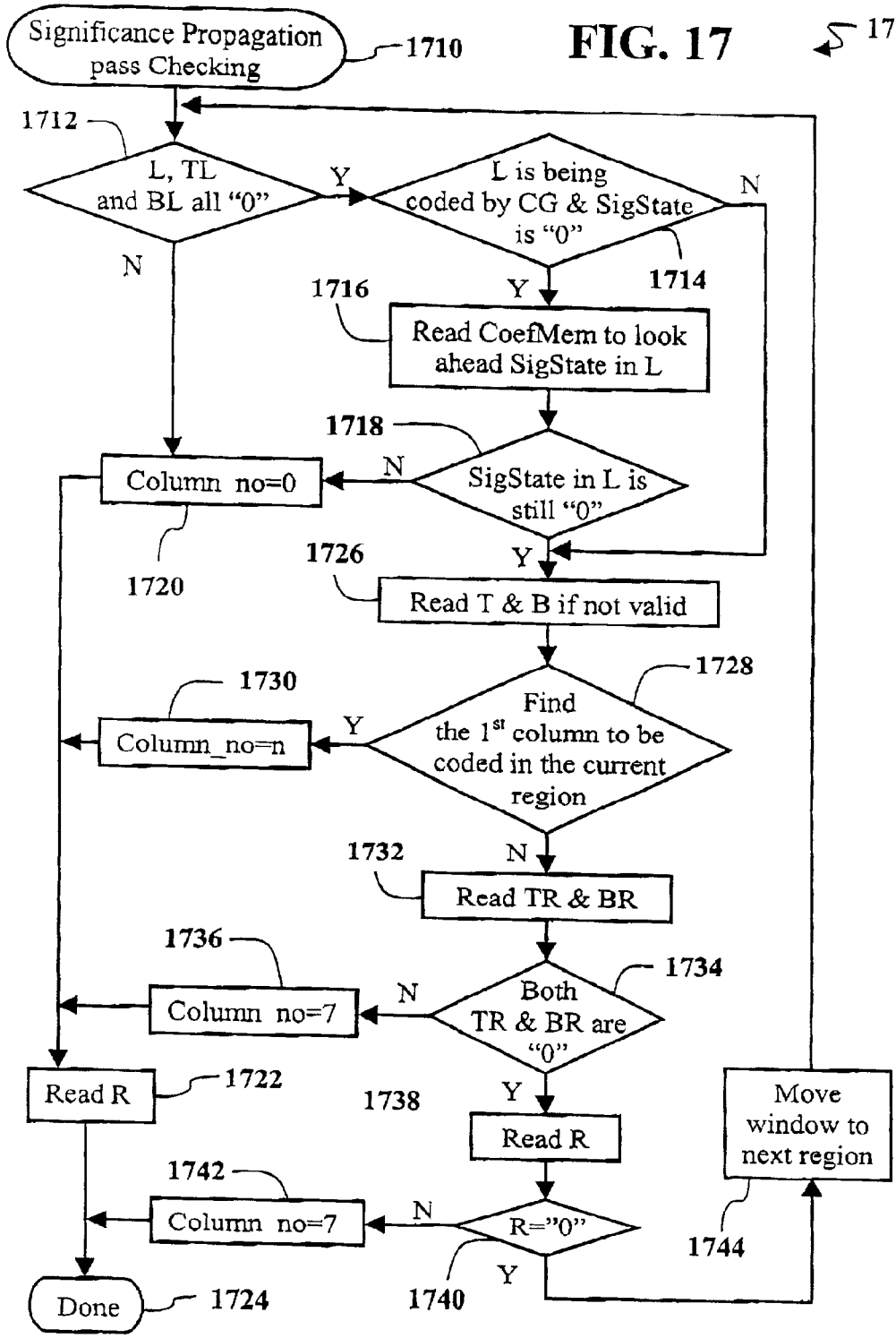
FIG. 17 is a detailed flow diagram illustrating a significance-propagation-pass checking process in accordance with the embodiment of the invention.

The Significance Propagation pass follows the same sequence as in $1^{st}$ Cleanup pass process 1400 shown in FIG. 14. The procedure for checking whether the current region should be coded in the Significance Propagation pass is illustrated in FIG. 17.

Processing commences in step 1710. In decision block 1712, a check is made to determine if the SigState of regions L, TL and BL are all 0. That is, a check is made to determine if any of the SigStates of these regions are significant. If decision block 1712 returns false (N), processing continues at step 1720. In step 1720, column number 0 is set to be the first column to be coded Processing then continues at step 1722. In step 1722, the right R region is read. Processing then terminates at step 1724. Otherwise, if decision block 1712 returns true (Y), processing continues at decision block 1714.

In decision block 1714, a check is made to determine if the CG module 1120 is coding the left L region using the Significance Propagation pass and the SigState is all zero currently. If decision block 1714 returns false (N), processing continues at step 1726. Otherwise, if decision block 1714 returns true (Y), processing continues at step 1716. In step 1716, the coefficient memory 1140 is read to look ahead at the SigState in the L region. That is, to make sure that the SigState in the L region does not change after the CG module 1120 codes the L region, the BC module 1160 reads the corresponding coefficient memory 1140 to retrieve the bit and looks ahead at the possible SigState changes.

In decision block 1718, a check is made to determine if the SigState in the L region is still 0. If decision block 1718 returns false (N), processing continues at step 1720. Again this signals the CG module 1120 that column zero is the first column to be coded. Otherwise, if decision block 1718 returns true (Y), processing continues at step 1726. That is, if the SigState in the L region is still all zero, the BC module 1160 finds the first column to be coded in this region.

In step 1726, the Top and Bottom regions are read if they are not valid. The Top and Bottom regions are only valid when TOP Right and Bottom Right regions have been read from the previous region. Processing then continues at decision block 1728.

In decision block 1728, a check is made to find the first column to be coded in the current region.

Figure 18:
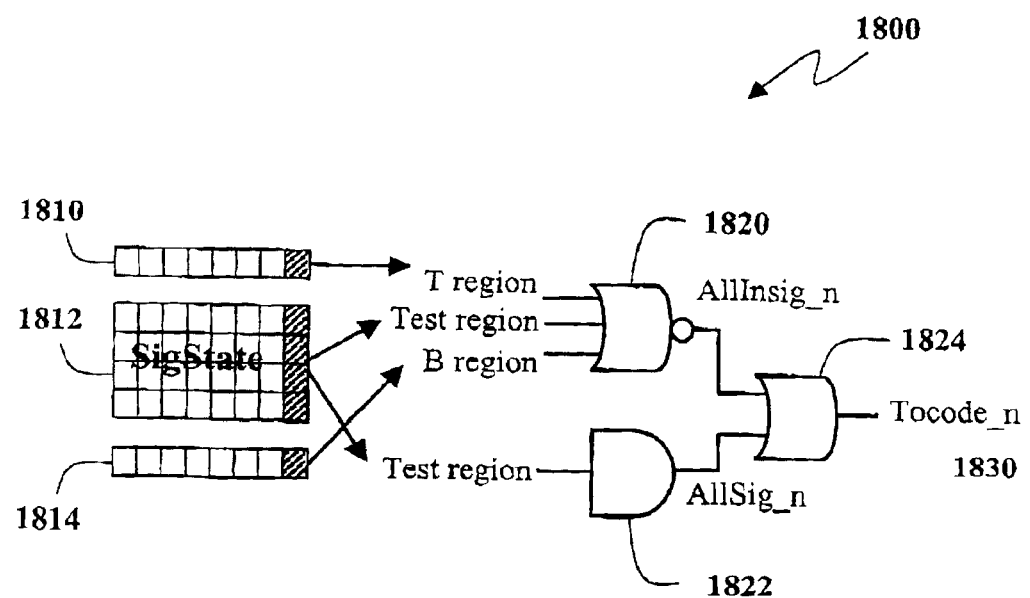
FIG. 18 is a circuit level diagram illustrating a circuit to test each column for Significance Propagation bypass in accordance with the embodiment of the invention.

The check to find the first column to be coded in this region can be implemented using a circuited 1800 to test each column for Significance Propagation bypass shown in FIG. 18. The circuit 1800 includes a NOR gate 1820, an AND gate 1822 and an OR gate 1830. The NOR gate 1820 has three inputs: a bit of interest from T region 1810, all bits of interest from the test region of the SigState 1812, and a bit of interest from the B region 1814. The output AllInsig_n produced by the NOR gate 1820 is provided as input to the OR gate 1824. The AND gate 1822 has input all the bits of interest from the test region 1812. The output of the AND gate 1822 AllSig_n is input to the OR gate 1824. The output of the OR gate 1824 is the signal Tocode_n 1830.

To find the $1^{st}$ column to be coded in this region, the circuit 1800 shown in FIG. 18 is used. There are 8 groups of this circuit 1800 to test each column. The three outputs from each circuit 1800 are named AllSig_n, AllInsig_n and Tocode_n and indicate "all significant in this column", "all insignificant in this column" and "to be coded in this column", respectively. These outputs decide which column is the $1^{st}$ column to be coded or if there is nothing to code in this region.

The $1^{st}$ column to be coded is column_n where Tocode_n is the $1^{st}$ "0" output, if AllSig_n−1 equals to "1". The $1^{st}$ column to be coded is the column_n−1 where Tocode is the $1^{st}$ "0" output, if AllSig_n−1 equals to "0".

Referring back to FIG. 17, if decision block 1728 returns true (Y), processing continues at step 1730. In step 1730, the column number to be coded is set equal to n. Processing then continues at step 1722. Otherwise, if decision block 1728 returns false (N), processing continues at step 1732 That is, if none of Tocode_n equals to "0", the BC module 1160 reads region TR and BR in step 1732.

In decision block 1734, a check is made to determine if both TR and BR are all zero. If decision block 1734 returns false (N), processing continues at step 1736. In step 1736, the column number is set equal to 7, and processing continues at step 1722. That is, in decision block 1734, the SigState of the TR and BR regions are checked. In particular, only the bits of interest shown in FIG. 16 are checked. If decision block 1734 returns true (Y) indicating that both are zero, processing continues at step 1738. In step 1738, region R is read. In decision block 1740, a check is made to determine if R="0". That is column zero is checked to determine if the SigState in column zero is all zero. If decision block 1740 returns false (N), processing continues at step 1742. In step 1742, the column number is set equal to 7. Processing then terminates in step 1724. Otherwise, if decision block 1740 returns true (Y), processing continues in step 1744. In step 1744, the BC module 1160 moves the window to the next region. Processing then continues at decision block 1712 and checking on the new region starts again.

With reference to step 1744, the next region to check is the region having a SigMatrix that is "1" or with any SigMatrix equal to "1" in the neighbour regions. If any of the TR, BR or R regions is "1", column7 is the first column to be coded, per steps 1736 and 1742, respectively.

If region R is not ready, the BC module 1160 launches a read to the ScratchMem module 1110 and signals the CG module 1120 to grab the command. Region R is loaded into the current region buffer for the BC module 1160 and the $1^{st}$ column of region R is loaded into region R buffer of the CG module 1160, when the CG module 1160 grabs the command.

3.4.3 Magnitude Refinement Pass

When the BC module 1160 finishes the Significance Propagation pass 1700, the module 1160 immediately starts to look for the next region that needs to be coded in the Magnitude Refinement pass. The BC module 1160 starts from the $1^{st}$ region having a SigMatrix bit that is "1". If there is any bit in this region that needs to be coded in Magnitude Refinement pass, the BC module 1160 signals the CG module 1120 by placing the region number and column number, where the $1^{st}$ to be coded bit is found, on the control bus. Otherwise, the BC module 1160 moves on to the next region.

The Magnitude Refinement pass follows the same sequence as in the $1^{st}$ Cleanup pass process 1400 shown in FIG. 14. Once the region is loaded into the buffer 1616 in FIG. 16, the BC module 1160 checks if there is any bit with a SigState equal to "1" while the Coded region is equal to "0". If any such bit, the BC module 1160 also loads the neighbour region having a SigMatrix bit that is equal to 1. The BC module 1160 then sets the Column_no and signals the CG module 1120. Otherwise, the BC module 1160 moves to the next region and starts checking on the new region again. The next region to check is the $1^{st}$ region after the current region having a SigMatrix bit that is equal to "1".

3.4.4 Cleanup Pass

When the BC module 1160 finishes the Magnitude Refinement pass, the BC module 1160 immediately starts to look for the next region that needs to be coded in the Cleanup pass The BC module 1160 follows the same sequence as in $1^{st}$ Cleanup pass 1400 shown in FIG. 14.

The BC module 1160 starts from the top left region and checks if there is any Coded bit equal to "0". If there is any such bit, the BC module 1160 also loads the neighbour region, having a SigMatrix bit that is equal to "1", to the SigState buffer. Then the BC module 1160 places the region number and column number, where the $1^{st}$ to be coded bit is found, on the control bus and signals the CG module 1120.

After the CG module 1120 grabs the command, the BC module 1160 loads the next region, and starts the same checking again. The next region is the region immediately following the current region. If the next region is the region on the right hand side of the current region, each buffered neighbour region is shifted to the left, eg. TR to T, BR to B, T to TL and B to BL. If there is no bit to be coded in the current region, the BC module 1160 then moves to the next region and starts the same checking again. When the BC module 1160 finishes checking all regions, the BC module 1160 continues the Significance Propagation checking process if there are any remaining bit planes, which have not been coded.

3.5 CG Module

Figure 19:
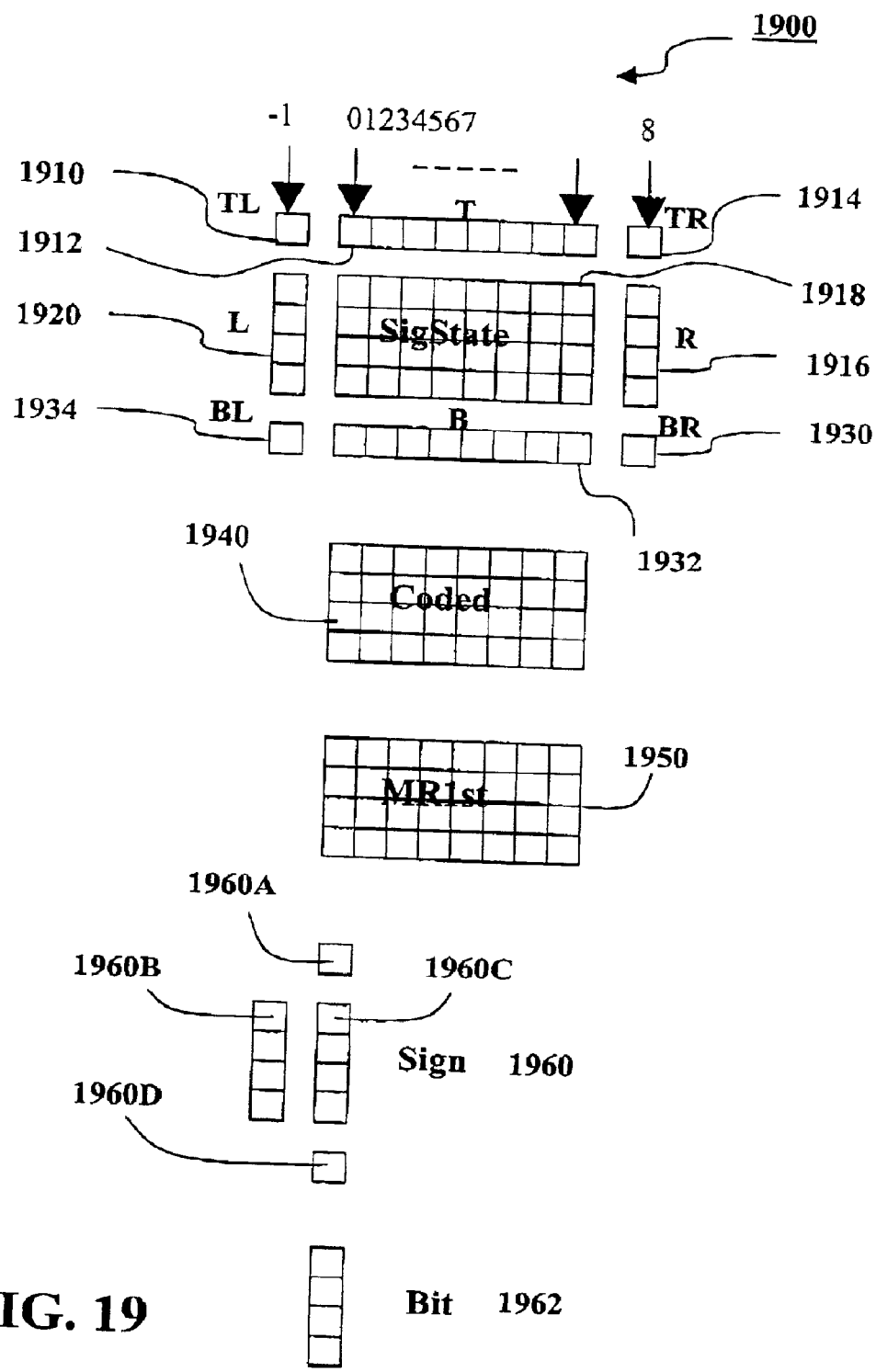
FIG. 19 is a schematic diagram illustrating a register buffer for the context generation module in accordance with the embodiment of the invention.

The CG module 1120 has the register buffers 1900 shown in FIG. 19 for the context generation. The SigState, Coded and MR1st buffers 1910–1934, 1940, 1950 get input data from the corresponding BC module 1160, while the Sign and Bit buffers 1960, 1962 are loaded from the CoefMem module 1140 before the context is generated from each column. The buffers include TL 1910, T 1912, TR 1914, L 1920, SigState 1918, R 1916, BL 1934, B 1932, and BR 1930. The sign register 1960 contains a first one bit cell 1960A on top, a 4 bit cell 1960B to the left, another 4 bit cell 1960C, and a bottom 1 bit cell 1960D.

TL 1910, L 1920, BL 1934, and sign 1960B are in column −1. TR 1914, R, 1916, and BR 1930 are in column S.

The SigState, Coded and MR1st data 1918, 1940, 1950 of the $1^{st}$ column to be coded is loaded into column 0 of these buffers using the Column_no presented on the control bus as index and the corresponding Sign and Bit data 1960, 1962 is read from the CoefMem module 1140 using the combination of Region_no and Column_no.

In each pass, a termination circuit (not shown) is used to determine where the next column to be coded is or if the region has finished being coded. When the CG module 1120 finishes coding a region, the updated SigState, Coded and MR1st data 1918, 1940, 1950 are written back to the ScratchMem module 1160. The CG module 1120 terminates coding in a region before reaching the last column when the CG module 1120 detects nothing to code in the remaining columns. In such a case, the CG module 1120 writes back the SigState, Coded and MR1st buffer 1918, 1940, 1950 to the ScratchMem module 1110 and signals the BC module 1160 the readiness for the next region of the CG module 1120. If the region has not finished, the termination circuit sends a number of columns to rotate signal (Rotate_no) to the RotateLeft function, which rotates the next column to be coded to column 0.

Context generation happens in column 0. The $1^{st}$ to be coded column is loaded into column 0 with the left-hand side neighbour column loaded into column −1 as shown in FIG. 19. The array is rotated left when the CG module 1120 finishes context generation in column 0. The next column to be coded is then located in column 0 after rotation. As a result, Sign and Bit data align with column 0.

There is a counter, Remainder, which represents the remaining columns to be coded in the current region. The termination circuit uses Remainder to determine if the region has finished coding for the current pass. As the termination is checked after coding on column 0, the Remainder counter is first loaded with (7− column_no). For example, if the first column to start coding is column 2, the Remainder counter is 5, which means columns 3–7 remain. If column 7 is the first column to code, the Remainder column is 0. When the termination circuit determines the region has not finished and sends a Rotate_no signal to the RotateLeft function, the Remainder counter is decremented by Rotate_no.

The CG module 1120 continuously waits for the command sent by the BC module 1160. When a valid command is present on the control bus, the CG module 1120 decodes the Pass signal and executes one of the 4 procedures shown in FIG. 20.

Figure 20:
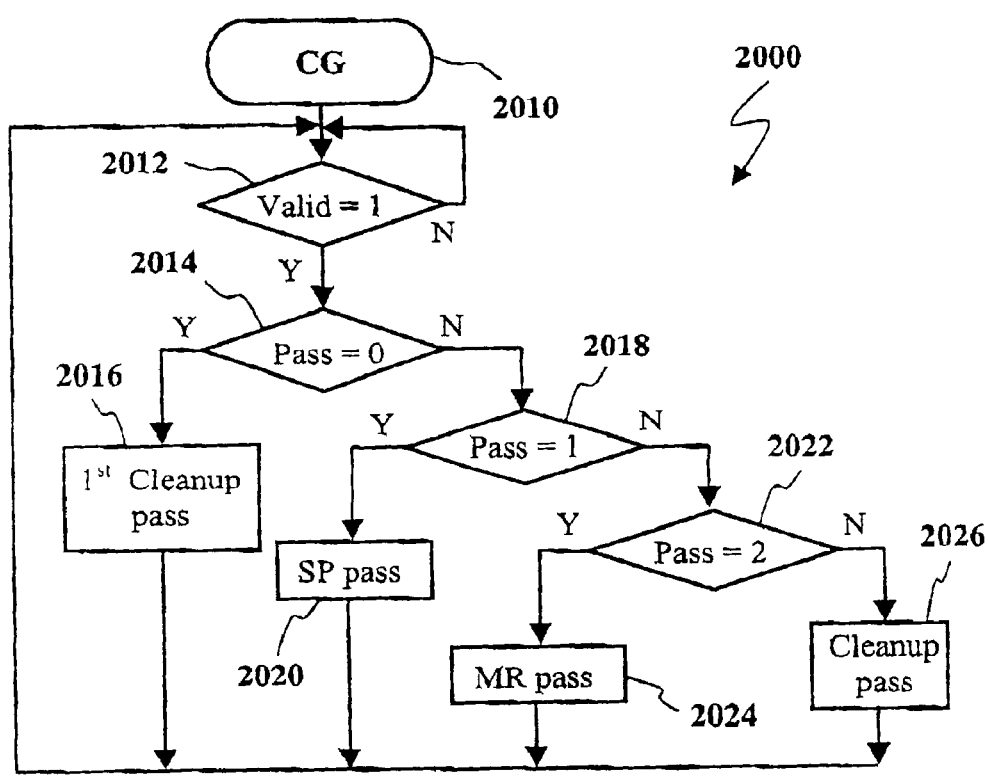
FIG. 20 is a flow diagram illustrating the processing of the context generation module in accordance with the embodiment of the invention.

The CG flow process 2000 of FIG. 20 commences in step 2010. In decision block 2012, a check is made to determine if the bit on control bus 1162 is valid (valid=1). If decision block 2012 returns false (N), processing continues at decision block 2012. Otherwise, if decision block 2012 returns true (Y), processing continues at decision block 2014.

In decision block 2014, a check is made to determine if the pass is equal to zero. If decision block 2014 returns true (Y), processing continues at step 2016. In step 2016, the 1$^{st}$ Cleanup pass is performed. Processing then continues at decision block 2012. Otherwise, if decision block 2014 returns false (N), processing continues at decision block 2018.

In decision block 2018, a check is made to determine if pass=1. If decision block 2018 returns true (Y), processing continues at step 2020. In step 2020, the Significance Propagation pass is performed. Processing then continues at decision block 2012. Otherwise, if decision block 2018 returns false (N), processing continues at decision block 2022.

In decision block 2022, a check is made to determine if pass 2. If decision block 2022 returns true (Y), processing continues at step 2024. In step 2024, a Magnitude Refinement pass is performed. Processing then continues at decision block 2012. Otherwise, if decision block 2022 returns false (N), processing continues at step 2026. In step 2026, a Cleanup pass is performed. Processing then continues at decision block 2012.

3.5.1 RotateLeft 1~7

The RotateLeft 1~7 operation allows columns to be skipped that have not been coded in the current pass.

When CG module 1120 finishes context generation in column 0, the module 1120 rotates the contents left by 1 to 7 columns as per the termination detection circuit output and thus keeps the column to be coded in column 0. Table 5 lists the RotateLeft operation for 3 buffers, where n is the number of columns to rotate.

CG_Coded[0 . . . 7−n]<=CG_Coded[n . . . 7]
CG_MR1st[0 . . . 7−n]<=CG_MR1st[n . . . 7]
CG_Coded[8−n . . . 7]<=CG_Coded[0 . . . n−1]
CG_MR1st[8−n . . . 7]<=CG_MR1st[0 . . . n−1]
Let CG_SigState be A.

TABLE 5

| | n | | | | | | |
|---|---|---|---|---|---|---|---|
| | 1 | 2 | 3 | 4 | 5 | 6 | 7 |
| A[−1] | A[0] | A[1] | A[2] | A[3] | A[4] | A[5] | A[6] |
| A[0] | A[1] | A[2] | A[3] | A[4] | A[5] | A[6] | A[7] |
| A[1] | A[2] | A[3] | A[4] | A[5] | A[6] | A[7] | A[8] |
| A[2] | A[3] | A[4] | A[5] | A[6] | A[7] | A[8] | A[−1] |

TABLE 5-continued

| | n | | | | | | |
|---|---|---|---|---|---|---|---|
| | 1 | 2 | 3 | 4 | 5 | 6 | 7 |
| A[3] | A[4] | A[5] | A[6] | A[7] | A[8] | A[−1] | A[0] |
| A[4] | A[5] | A[6] | A[7] | A[8] | A[−1] | A[0] | A[1] |
| A[5] | A[6] | A[7] | A[8] | A[−1] | A[0] | A[1] | A[2] |
| A[6] | A[7] | A[8] | A[−1] | A[0] | A[1] | A[2] | A[3] |
| A[7] | A[8] | A[−1] | A[0] | A[1] | A[2] | A[3] | A[4] |
| A[8] | A[−1] | A[0] | A[1] | A[2] | A[3] | A[4] | A[5] |

3.5.2 Initial Buffer Loading

The initial buffer loading depends on the Column_no signal on the control bus. For the Coded and MR1st buffers 1940, 1950, the loading is straightforward. Column_no is equal to n, and the initial loading for Coded and MR1st buffers 1940, 1950 is described in Table 6.

TABLE 6

CG_Coded[0..7−n]<=BC_Coded[n..7]
CG_MR1st[0..7−n]<=BC_MR1st[n..7]
If n > 0, the other part of the buffer is:
CG_Coded[8−n..7]<=BC_Coded[0..n−1]
CG_MR1st[8−n..7]<=BC_MR1st[0..n−1]

The initial loading for the SigState buffer 1918 is shown in Table 7. The CG_SigState is A and BC_SigState is B.

TABLE 7

| | Source data to be loaded into CG from BC according to Column no | | | | | | | | |
|---|---|---|---|---|---|---|---|---|---|
| CG | 0 (note 1) | 0 (note 2) | 1 | 2 | 3 | 4 | 5 | 6 | 7 |
| A[−1] | B[−1] | A[7−n] | B[0] | B[1] | B[2] | B[3] | B[4] | B[5] | B[6] |
| A[0] | B[0] | B[0] | B[1] | B[2] | B[3] | B[4] | B[5] | B[6] | B[7] |
| A[1] | B[1] | B[1] | B[2] | B[3] | B[4] | B[5] | B[6] | B[7] | B[8] |
| A[2] | B[2] | B[2] | B[3] | B[4] | B[5] | B[6] | B[7] | B[8] | 0 |
| A[3] | B[3] | B[3] | B[4] | B[5] | B[6] | B[7] | B[8] | 0 | B[0] |
| A[4] | B[4] | B[4] | B[5] | B[6] | B[7] | B[8] | 0 | B[0] | B[1] |
| A[5] | B[5] | B[5] | B[6] | B[7] | B[8] | 0 | B[0] | B[1] | B[2] |
| A[6] | B[6] | B[6] | B[7] | B[8] | 0 | B[0] | B[1] | B[2] | B[3] |
| A[7] | B[7] | B[7] | B[8] | 0 | B[0] | B[1] | B[2] | B[3] | B[4] |
| A[8] | B[8] | B[8] | 0 | B[0] | B[1] | B[2] | B[3] | B[4] | B[5] |

Note 1: The new region is not on the right hand side of the current region.
Note 2: The new region is on the right hand side of the current region, and n is the column where the termination happens in the current region.

3.5.3 Write Back to ScratchMem

When the CG module 1120 finishes context generation for a region, the contents of SigState, Coded and MR1st buffers 1918, 1940, 1950 are written back to the ScratchMem module 1110 to maintain the state throughout the coding of a code block. As the context generation for a region in any particular pass can be terminated before the CG module 1120 scans to the last column, the ScratchMem module 1110 is updated according to the last column where the termination happens.

The result of ORing all bits in the SigState is written to the corresponding SigMatrix bit to assist the BC module in later passes.

The column n is the column where CG finishes context generation in a region. The Coded and MR1st buffers 1940, 1950 are written back to the ScratchMem module 1110 as shown in Table 8.

TABLE 8 when n > 0
ScratchMem__Coded[Region__no][0..n−1]<=CG__Coded[8−n..7]
ScratchMem__MR1st[Region__no][0..n−1]<=CG__MR1st[8−n..7]
ScratchMem__Coded[Region__no][n..7]<=BC__Coded[0..7−n]
ScratchMem__MR1st[Region__no][n..7]<=BC__MR1st[0..7−n]
when n ≅ 0
ScratchMem__Coded[Region__no][0..7]<=CG__Coded[0 .7]
ScratchMem__MR1st[Region__no][0..7]<=CG__MR1st[0..7]

The ScratchMem update for the SigState buffer 1918 in the Region__no is shown in Table 9. The ScratchMem__SigState[Region__no] is A and the CG__SigState is B.

TABLE 9

| | The last column where CG finishes | | | | | | | |
|---|---|---|---|---|---|---|---|---|
| ScratchMem | 0 | 1 | 2 | 3 | 4 | 5 | 6 | 7 |
| A[0] | B[0] | B[−1] | B[8] | B[7] | B[6] | B[5] | B[4] | B[3] |
| A[1] | B[1] | B[0] | B[−1] | B[8] | B[7] | B[6] | B[5] | B[4] |
| A[2] | B[2] | B[1] | B[0] | B[−1] | B[8] | B[7] | B[6] | B[5] |
| A[3] | B[3] | B[2] | B[1] | B[0] | B[−1] | B[8] | B[7] | B[6] |
| A[4] | B[4] | B[3] | B[2] | B[1] | B[0] | B[−1] | B[8] | B[7] |
| A[5] | B[5] | B[4] | B[3] | B[2] | B[1] | B[0] | B[−1] | B[8] |
| A[6] | B[6] | B[5] | B[4] | B[3] | B[2] | B[1] | B[0] | B[−1] |
| A[7] | B[7] | B[6] | B[5] | B[4] | B[3] | B[2] | B[1] | B[0] |

While updating the ScratchMem module, the, result of ORing all the bits in the SigState array is also written to the corresponding SigMatrix bit to assist the BC module in the later passes.

3.5.4 $1^{st}$ Cleanup Pass

Figure 21:
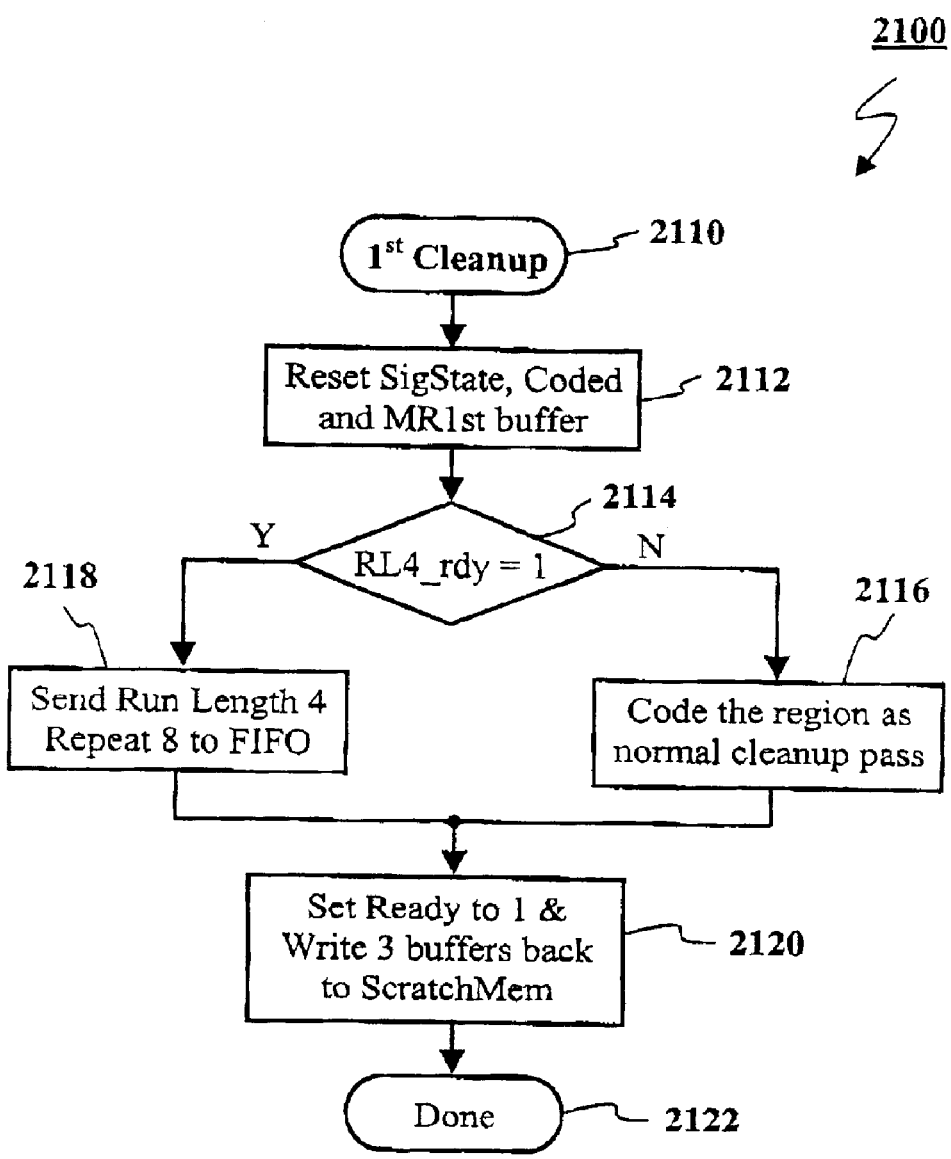
FIG. 21 is a flow diagram illustrating the first cleanup pass process implemented by the context generation module in accordance with the embodiment of the invention.

The CG module 1120 performs the $1^{st}$ Cleanup pass when the Pass signal on the control bus is 0. The CG module 1120 does special Run Length 4 repeat coding when the RL4__rdy signal is 1. FIG. 21 illustrates context generation for a region when the BC module 1160 signals a $1^{st}$ Cleanup pass on the control bus.

The first Cleanup pass process 2100 commences in step 2110. In step 2112, the SigState, Coded and MR1st buffers 1918, 1940 and 1950 are reset. In decision block 2114, a check is made to determine if the RL4__rdy signal is equal to 1. If decision block 2114 returns true (Y), processing continues at step 2118. In step 2118, a run length 4 repeat 8 command is sent to the FIFO. Processing then continues at step 2120. Otherwise, if decision block 2114 returns false (N), the region is coded as a normal Cleanup pass in step 2116, before proceeding to step 2120. In step 2120, the Ready signal is set to 1 and the three buffers 1918, 1940, 1950 are written back to the scratch memory module 1110. Processing then terminates in step 2122.

3.5.5 Significance Propagation Pass

Figure 22:
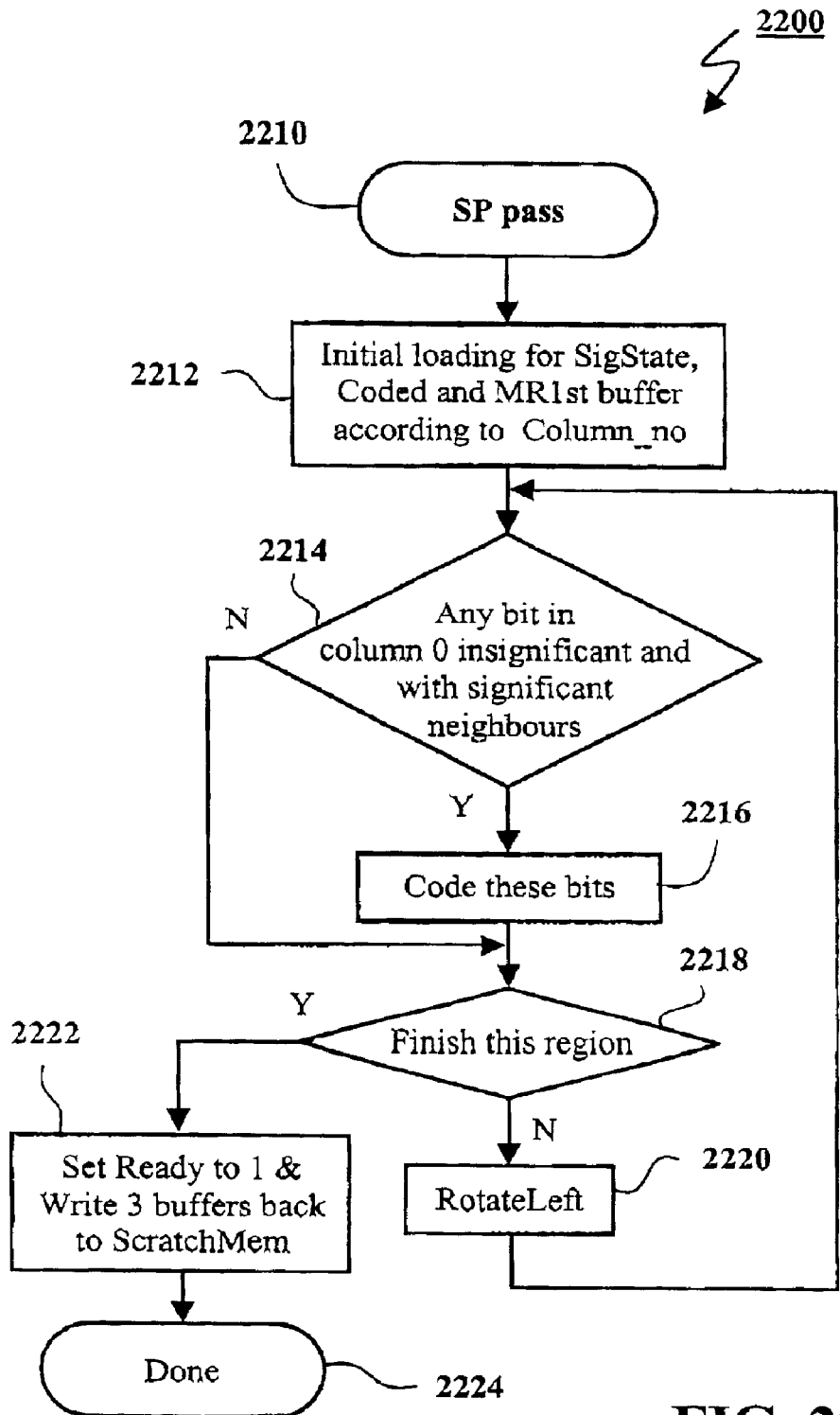
FIG. 22 is a flow diagram illustrating the significance propagation pass carried out by the context generation module in accordance with the embodiment of the invention.

The CG module 1120 performs the Significance Propagation Pass when the Pass signal on the control bus is 1. FIG. 22 illustrates a process 2200 for context generation for a region when the BC module 1160 signals a Significance Propagation pass on the control bus.

Processing commences in step 2210. In step 2212, the SigState, Coded and MR1st buffers 1918, 1940 and 1950 are loaded initially according to the column__no.

In decision block 2214, a check is made to determine if any bit in column 0 is insignificant and has significant neighbours. If decision block 2214 returns false (N), processing continues at decision block 2218. Otherwise, if decision block 2214 returns true (Y), processing continues at step 2216. In step 2216, the bits are coded. Processing then continues at step 2218. In decision block 2218, a check is made to determine if the Significance Propagation pass has finished for this region.

A termination circuit (not shown) detects if the region has finished coding or where the next column to be coded is in the current region. The circuit checks any insignificant bit with significant neighbours in each column from column 1 to column Remainder, and terminates coding if there is not an insignificant bit with significant neighbours between column 1 to column Remainder. Thus, if decision block 2218 returns true (Y), processing continues at step 2222. In step 2222, the CG module 1120 writes the three buffers 1918, 1940, 1950 back to the scratch memory module 1110 according to the column where the Significance Propagation pass terminates and then signals the BC module 1160 for the next command. Processing then terminates in step 2224.

If decision block 2218 returns false (N), processing continues at step 2220. In step 2220, a Rotateleft operation is performed. Thus, if there is any insignificant bit with significant neighbours between column 1 to column Remainder, the termination circuit sends Rotate__no signal to RotateLeft function and the next column to be coded is rotated to column 0 for coding. Rotate__no is the column where the next column to be coded is found. For example if the next column to be coded is found in column 3, Rotate__no is 3. Remainder is decremented by Rotate__no after RotateLeft operation. When Remainder is 0, the termination circuit does not perform any checking but terminates the coding. Processing then continues at decision block 2214.

3.5.6 Magnitude Refinement Pass

Figure 23:
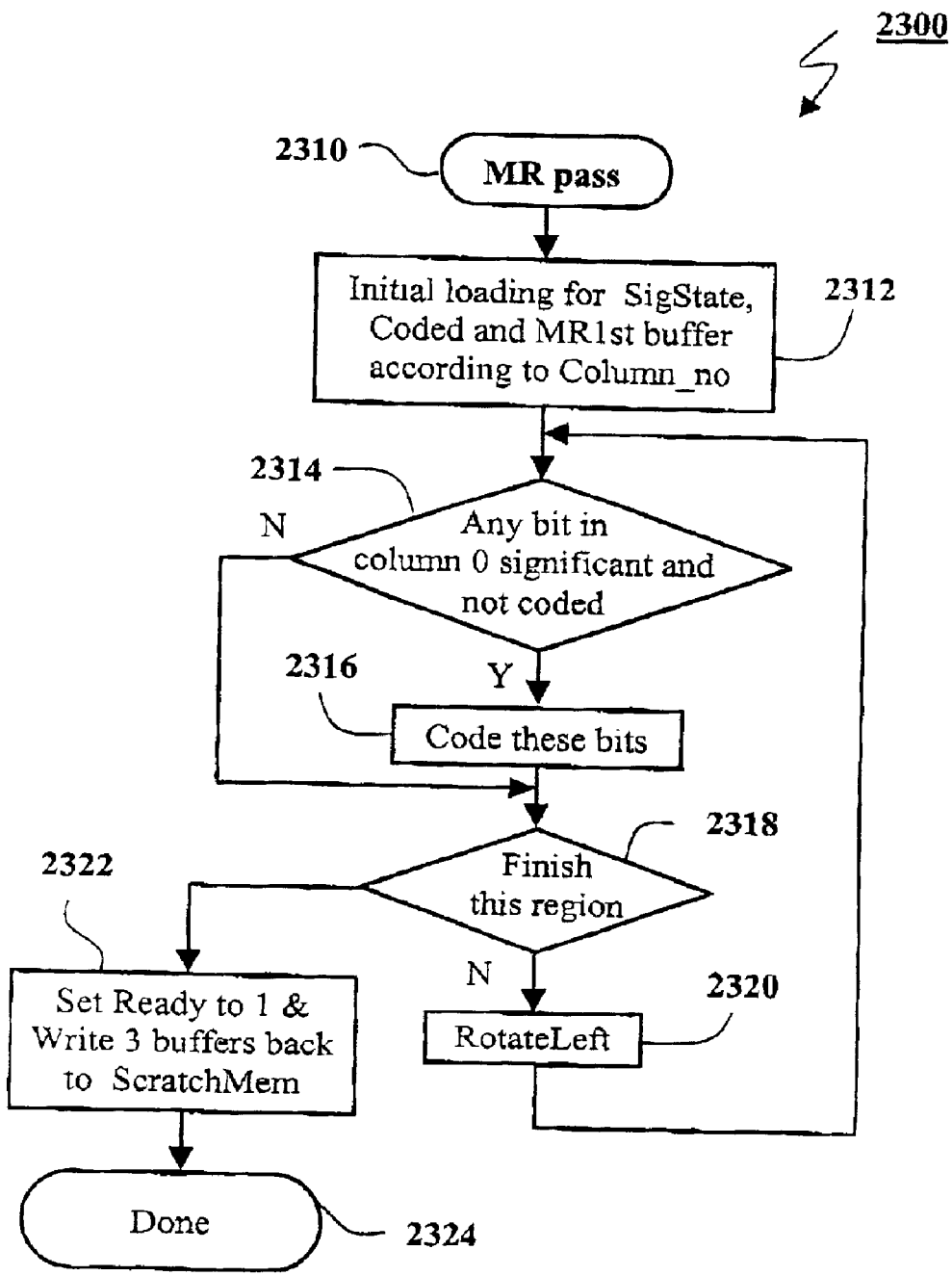
FIG. 23 is a flow diagram illustrating the magnification refinement process implemented by the context generation module in accordance with the embodiment of the invention.

The CG module 1120 performs the Magnitude Refinement Pass when the Pass signal on the control bus is 2. FIG. 23 is a flow diagram illustrating a process 2300 for context generation for a region when the BC module 1160 signals Magnitude Refinement pass on the control bus. Processing commences in step 2310. In step 2312, the SigState, Coded and MR1st buffers 1918, 1940, 1950 are loaded initially according to the column number column__no.

In decision block 2314, a check is made to determine if any bit in column 0 is significant and not coded. If decision block 2314 returns false (N), processing continues at step 2318. Otherwise, if decision block 2314 returns true (Y), processing continues at step 2316. In step 2316 the bits are coded. Processing then continues at decision block 2318. In decision block 2318, a check is made to determine if the Magnitude Refinement pass has finished for the current region A termination circuit (not shown) detects if the region has finished being coded or if the next column to be coded is in the current region. The circuit checks any significant and not coded bit in each column from column 1 to column Remainder, and terminates coding if there is not any significant and not coded bit from column 1 to column Remainder. If decision block 2318 returns true (Y), processing continues at step 2322. Step 2322 writes the 3 buffers back to the ScratchMem module 1110 according to the column where the Magnitude Refinement pass terminates and signals the BC module 1160 for next command Processing terminates in step 2324.

If decision block 2318 returns false (N), processing continues at decision block 2320. In step 2320, a RotateLeft operation is performed upon the region. Thus, if there is any significant and not coded bit between column 1 to column Remainder, the termination circuit sends Rotate__no signal to RotateLeft function and the next column to be coded is rotated to column 0 for coding. Rotate_no is the column where the next column to be coded is found. For example if the next column to be coded is found in column 3, Rotate_no is 3. Remainder is decremented by Rotate_no after RotateLeft operation. When Remainder is 0, the termination circuit does not perform any checking but terminates the coding. Processing then continues at decision block 2314.

3.5.7 Cleanup Pass

Figure 24:
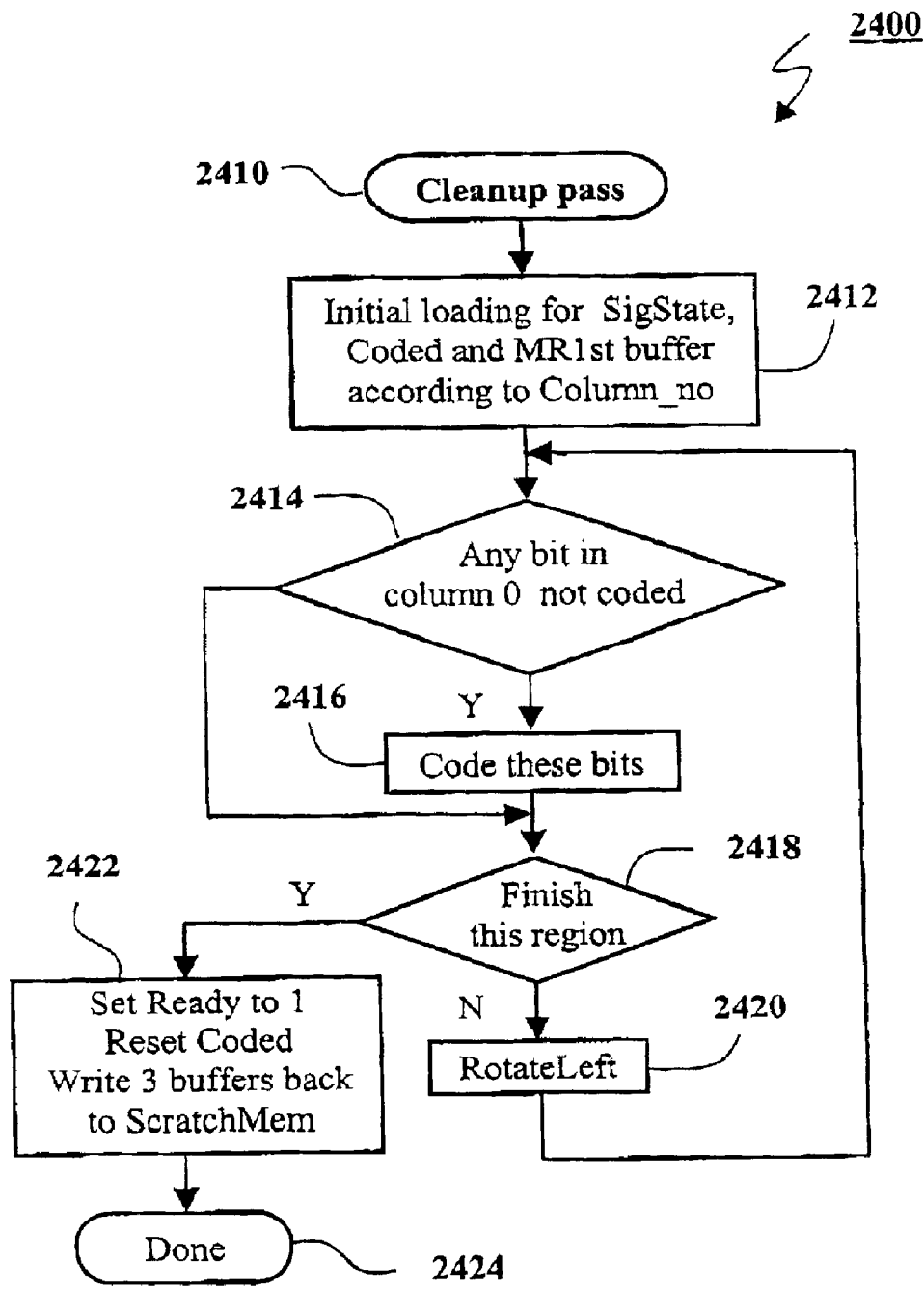
FIG. 24 is a flow diagram illustrating a cleanup pass process for the context generation module in accordance with the embodiment of the invention.

The CG module 1120 performs the Cleanup Pass when the Pass signal on the control bus is 3. FIG. 24 illustrates the Cleanup process 2400 of the CG module 1120 for context generation for a region when the BC module 1160 signals a Cleanup pass on the control bus. Processing commences in step 2410. In step 2412, the SigState, Coded, and MR1st buffers 1918, 1940, 1950 are initially loaded according to the column number.

In decision block 2414, a check is made to determine if any bit in column 0 for the region is not coded. If decision block 2414 returns false (N), processing continues at decision block 2418. Otherwise, if decision block 2414 returns true (Y), processing continues at step 2416. In step 2416, the bits are coded. Processing then continues at decision block 2418. In decision block 2418, a check is made to determine if the whole region is finished coding With reference to decision block 2418, the check is made by simply ANDing the bits of the Coded buffer. A "1" indicates the whole region is coded.

A termination circuit (not shown) detects if the region has finished coding or if the next column to be coded is in the current region. The circuit checks any not coded bit in each column from column 1 to column Remainder and terminates coding if all bits are all coded from column 1 to column Remainder. If decision block 2418 returns true (Y), processing continues at step 2422. In step 2422, the CG module 1120 resets the coded buffer 1940 and writes the 3 buffers 1918, 1940, 1950 back to the scratch memory module 1110 according to the column where the Cleanup pass terminates. The CG module 1120 then signals the BC module 1160 for the next command by setting ready equal to 1. Processing then terminates in step 2424.

If decision block 2418 returns false (N), processing continues at step 2420. In step 2420, a RotateLeft operation is performed upon the region, and processing then continues at decision block 2414. If there is any not coded bit between column 1 to column Remainder, the termination sends Rotate_no signal to RotateLeft function and the next column to be coded is rotated to column 0 for coding. Rotate_no is the column where the next column to be coded is found. For example if the next column to be coded is found in column 3, Rotate_no is 3. Remainder is decremented by Rotate_no after RotateLeft operation. When Remainder is 0, the termination circuit does not perform any checking but terminates the coding.

4. Context Label Generator

Figure 28:
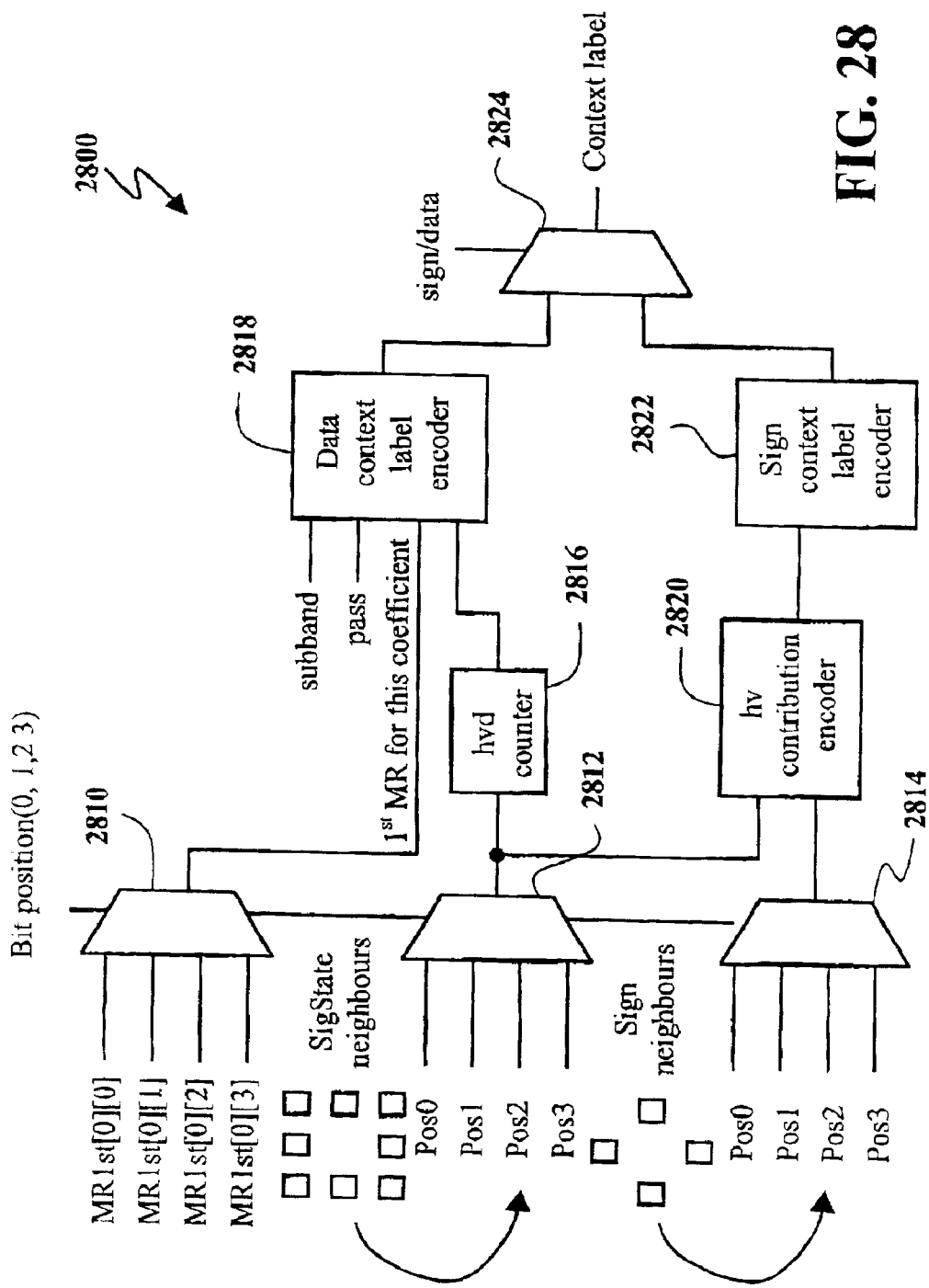
FIG. 28 is a block diagram of a context label generator in accordance with the embodiment of the invention.

The context label for each pass can be easily generated by a context label generator 2800 as shown in FIG. 28 according to the context defined in the JPEG 2000 standard draft when the required bits, eg. significance state for the neighbours, are made available. There are two kinds of context generated by the "data context label encoder" 2818 and the "sign context label encoder" 2822 respectively. The appropriate MR1st bit, significance state neighbours and sign neighbours are selected according to the bit position in column 0. These values are input to multiplexers 2810, 2812, and 2814, respectively. The bit position (0, 1, 2, 3) is used to control operation of the multiplexers 2810, 2812, 2814. Multiplexer 2810 provides $1^{st}$MR for the coefficient as input to a data context label encoder 2818. Subband and pass are inputs also to encoder 2818.

The data context label encoder 2818 generates context labels according to the current pass and subband of the code block, the pass signal is used to select between Table 10 and 13 listed hereinafter, and the subband signal is used to select the encoding condition to be used in Table 10 for the encoder 2818.

The output of the multiplexer 2812 is coupled to an hvd counter 2816 and hv contribution encoder 2820. The output of hvd encoder 2816 is a further input to the encoder 2818.

The multiplexer 2814 provides an input to the hv contribution encoder 2820 In turn, encoder 2820 provides an input to a sign context label encoder 2822. Both encoders 2818, 2822 provide inputs another multiplexer 2824, which has sign/data as control inputs and outputs the context label. The selected significance state neighbours are fed into hvd counter 2816, which counts the number of significance bits in the horizontal, vertical and diagonal neighbours, respectively. The output of the hvd counter 2816 (h count, v count and d count) and selected MR1st bit are fed into the data context label encoder 2818, which encodes the context label according to the current pass and subband. When coding the significance propagation pass and the cleanup pass, Table 10 describes the encoding of the context label. When coding the magnitude refinement pass, Table 13 is used to encode the context label.

The selected significance state neighbours from multiplexer 2812 are also fed into the hv contribution encoder 2820 along with the selected sign neighbours using the contribution method defined in Table 11. The output of horizontal and vertical contribution is then fed into the sign context label encoder 2822 using the method defined in Table 12. The final context label output by multiplexer 2824 is selected depending on if the current bit is a data or sign bit, which is input to control the multiplexer 2824.

This context label generator works with both the register array based method and the register window and memory based method.

TABLE 10

| LL and LH sub-bands | | | HL sub-band | | | HH sub-band | | Context |
|---|---|---|---|---|---|---|---|---|
| ƒ H | ƒ V | ƒ D | ƒ H | ƒ V | ƒ D | ƒ (H + V) | ƒ D | label[a] |
| 2 | X[b] | X | X | 2 | X | X | τ 3 | 8 |
| 1 | τ 1 | X | τ 1 | 1 | X | τ 1 | 2 | 7 |
| 1 | 0 | τ 1 | 0 | 1 | τ 1 | 0 | 2 | 6 |
| 1 | 0 | 0 | 0 | 1 | 0 | τ 2 | 1 | 5 |
| 0 | 2 | X | 2 | 0 | X | 1 | 1 | 4 |
| 0 | 1 | X | 1 | 0 | X | 0 | 1 | 3 |
| 0 | 0 | τ 2 | 0 | 0 | τ 2 | τ 2 | 0 | 2 |
| 0 | 0 | 1 | 0 | 0 | 1 | 1 | 0 | 1 |
| 0 | 0 | 0 | 0 | 0 | 0 | 0 | 0 | 0 |

[a]Note that the context labels are numbered only for identification. The actual identifiers used is a matter of implementation.
[b]X = do not care.

TABLE 11

| $V_0$ (or $H_0$) | $V_1$ (or $H_1$) | V (or H) contribution |
|---|---|---|
| Significant, positive | Significant, positive | 1 |
| Significant, negative | Significant, positive | 0 |
| Insignificant | Significant, positive | 1 |
| Significant, positive | Significant, negative | 0 |

TABLE 11-continued

| $V_0$ (or $H_0$) | $V_1$ (or $H_1$) | V (or H) contribution |
|---|---|---|
| Significant, negative | Significant, negative | −1 |
| Insignificant | Significant, negative | −1 |
| Significant, positive | Insignificant | 1 |
| Significant, negative | Insignificant | −1 |
| Insignificant | Insignificant | 0 |

TABLE 12

| Horizontal contribution | Vertical contribution | XORbit | Context label |
|---|---|---|---|
| 1 | 1 | 0 | 13 |
| 1 | 0 | 0 | 12 |
| 1 | −1 | 0 | 11 |
| 0 | 1 | 0 | 10 |
| 0 | 0 | 0 | 9 |
| 0 | −1 | 1 | 10 |
| −1 | 1 | 1 | 11 |
| −1 | 0 | 1 | 12 |
| −1 | −1 | 1 | 13 |

TABLE 13

| $fH + fV + fD$ | 1st refinement for this coefficient | Context label |
|---|---|---|
| X[a] | False | 16 |
| ≥1 | True | 15 |
| 0 | True | 14 |

[a]"X" indicates a "don't care" state.

5. Arithmetic Coder

An arithmetic coder codes 1 bit per clock cycle as the probability is adaptively estimated when the new bit and its context are received. A sequence of bits to be coded and their context may be known. In such a case, the coder according to the embodiments of the invention can generate a new code word for the sequence of bits as the probability is known.

Figure 25:
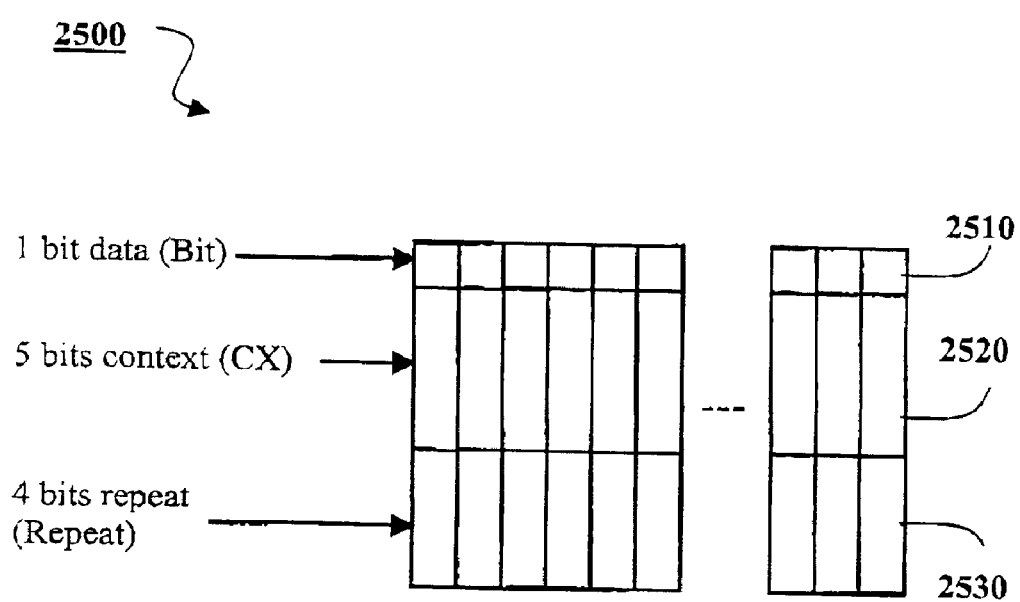
FIG. 25 is a block diagram illustrating the structure of a FIFO in accordance with the embodiment of the invention.

Thus, in accordance with the embodiments of the invention, apparatuses for JPEG 2000 entropy coding 100 (1100) include a context generator 110 (1120, 1110, 1160, 1140), an arithmetic coder 130 (1150), and a FIFO 120 (1130). A detailed diagram of a FIFO 2500 in accordance with the embodiment of the invention is shown in FIG. 25, as described hereinafter. The context generator 110 (1110, 1120, 1140, 1160) generates a context (CX) for a bit of a coefficient in a code block. The arithmetic coder 130 (1150) entropy codes the bit of the code block. The FIFO 120 (1130) is coupled between the context generator 110 (1110, 1120, 1140, 1160) and the arithmetic coder 130 (1150) and stores the bit, the context and the number of the bit and context pair. The context generator 110 (1110, 1120, 1140, 1160) is able to generate a repeat pattern (Repeat) of two or more bit and context pairs in a single clock cycle.

In the 1st Cleanup pass, most of the bits are coded with a RUN LENGTH 4 context. The collected statistics are first read before reading any bitplane data. Once a special 1st cleanup speed up condition is met, the RUN LENGTH 4 context and the number of repeats are sent to the FIFO 2500. The FIFO 2500 contains an entry 2510 for 1 bit of data, an entry 2520 for 5 bits of context (CX), and an entry 2530 for 4 bits of repeat (Repeat). A zero repeat is preferably interpreted as 16. In accordance with FIG. 1, this FIFO 2500 can be implemented as FIFO 120 of FIG. 1 between the context generator 110 and the arithmetic coder 130. The arithmetic coder 130 of FIG. 1 then processes the "repeat" command The time required to process this command depends on the state of the arithmetic coder 130.

Figure 27:
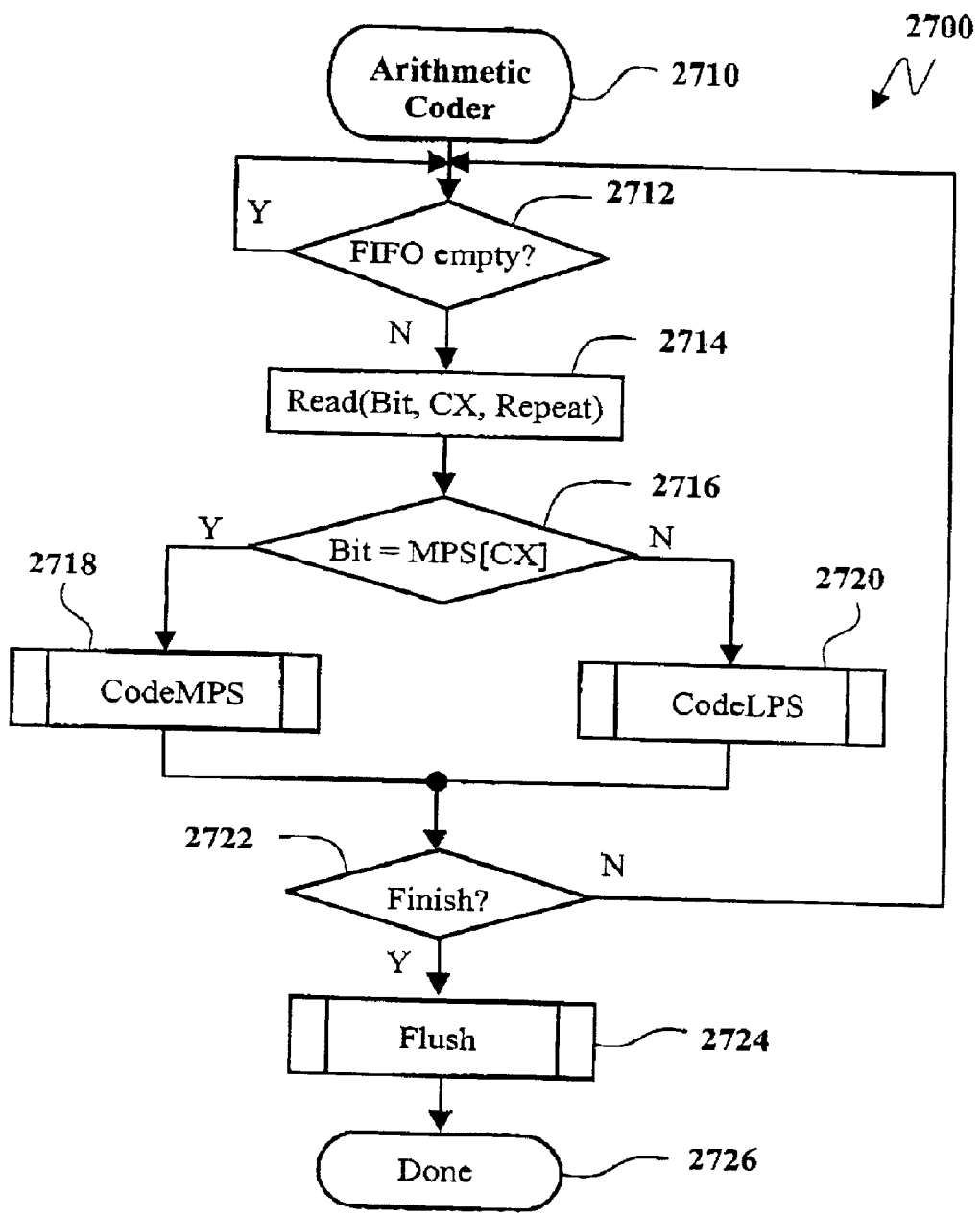
FIG. 27 is a flow diagram of the modified arithmetic coder.

FIG. 27 shows the overall processing 2700 of the arithmetic coder. Processing commences in step 2710. In decision block 2712, a check is made to determine if the FIFO 2500 is empty. If decision block 2712 returns true (Y), processing continues at decision block 2712. Otherwise, if decision block 2712 returns false (N), processing continues in step 2714.

In step 2714, the arithmetic coder fetches a set of Bit, CX and Repeat from the FIFO, which is not empty. In decision block 2716, a check is made to determine if Bit is the MPS with the context CX given. If decision block 2716 returns true (Y), CodeMPS process is executed in step 2718. Otherwise, if decision block 2716 returns false (N), CodeLPS process is executed in step 2720. From either step 2718 or 2720, processing continues at step 2727. After finishing coding a set of Bit, CX and Repeat, a check is made in decision block 2722 to determine if the Finish condition is met. The Finish condition is a combination of the FIFO being empty and the indication of completion of context generation from the context generator for a pass or a whole code block. The entropy coder can choose to terminate after a pass or a whole code block. If the Finish condition is not met (N), processing continues at decision block 2712 and the next set of data is fetched from the FIFO. Otherwise, if decision block 2722 returns true (Y), step 2724 flushes the arithmetic coder. Processing terminates in step 2726.

The speed up can take place when MPS is 0 and the upcoming command has a repeat number greater than 1 and its context is RUN LENGTH.

At least portions of the apparatuses 100 (1100) can be implemented as a computer program product. That is, aspects of the embodiment may be implemented in software. The computer program product includes a computer readable medium with a computer program for JPEG 2000 entropy coding recorded on the medium. The computer program product may also contain relevant data and data structures. The functionality employed by the apparatus can be implemented as code modules of the computer program. The functionality of this embodiment of the invention is described in greater detail hereinafter.

The apparatuses 100 (1100) pre-analyze transform coefficients of a code block in sign-magnitude form. Bit data 310, sign data 320, significance state data 330, coded data 340, and magnitude refinement data 350 for the code block are buffered using the register arrays for context generation. Statistical data about the coefficients is then stored, preferably with the coefficients in the coefficient memory 1000. Using this statistical data, one or more repeat commands described hereinbefore are generated for one or more sequences of bit and context pairs for arithmetic encoding by the coder 130 (1150). In the embodiment of the invention, a specific region of the code block can be switched to in any one of significance propagation, magnitude refinement, and cleanup coding passes using rotate-left and rotate-up operations of the register arrays. A region of a code block currently being coded is buffered using a register window and the remaining regions of the code block are separately buffered using the scratch memory 1110.

The bypass control module 1160 looks ahead for the next region of a code block to be coded in each of significance propagation, magnitude refinement, and cleanup coding passes. The context generation module 1120 generates the context of a region previously provided by the bypass control module 1160. Preferably, the bypass control and context generations modules 1120, 1160 operate in parallel.

Figure 26:
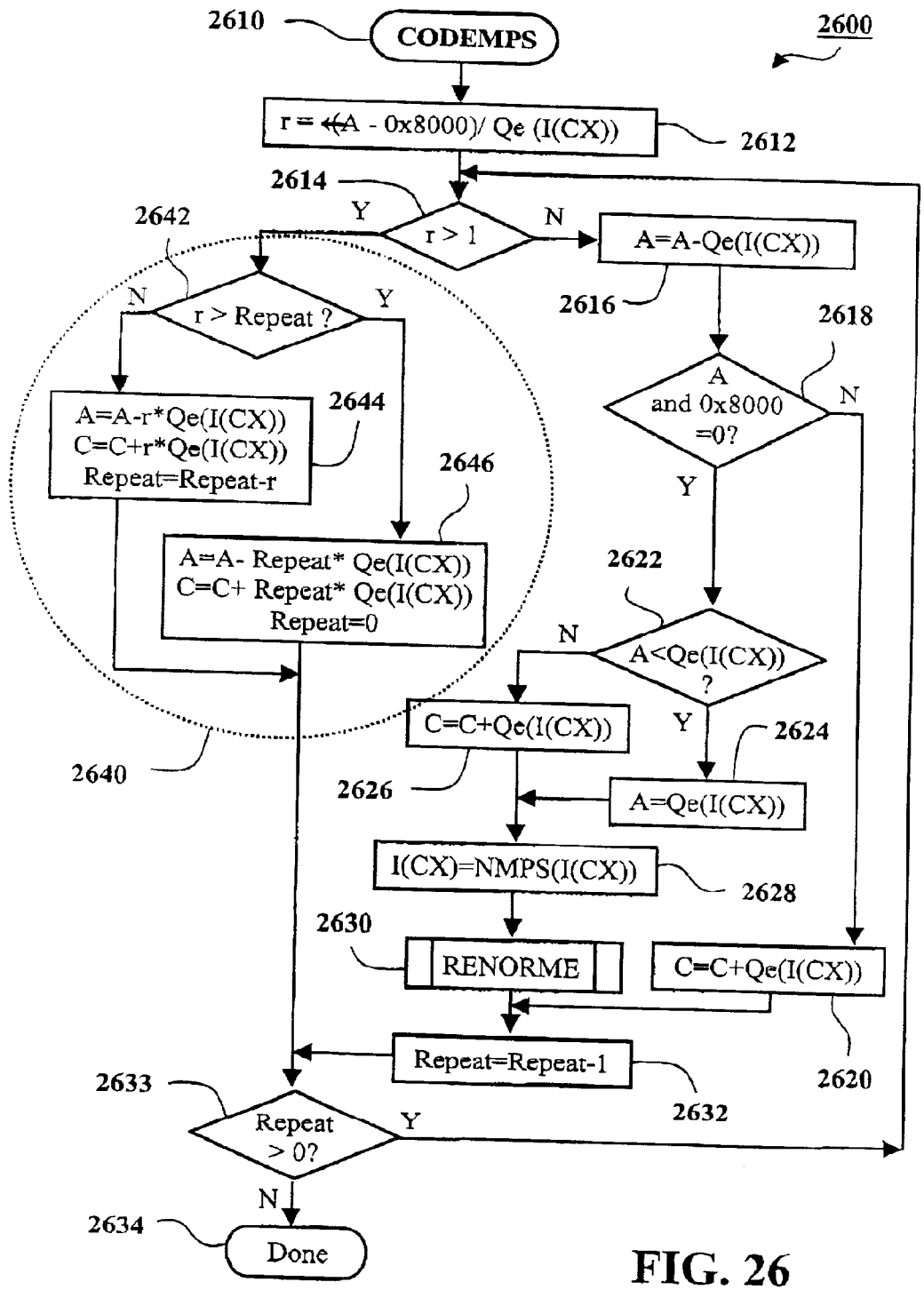
FIG. 26 is a detailed flow diagram illustrating a modified arithmetic coder (CODEMPS) process in accordance with the embodiment of the invention.

The arithmetic coder 1150 in accordance with the embodiment of the invention implements a modified CODEMPS process 2600 shown in FIG. 26, corresponding to step 2718 of FIG. 27. The circled special path 2640 in the diagram highlights the modification. Steps 2612, 2614, and 2632 are also modifications. Steps 2616–2630 form the standard CODEMPS process described in Annex C "Arithmetic entropy coding" of Coding of Still Pictures, JPEG 2000 Part I Final Draft International Standard (ISO/IEC JTC 1/SC 29/WG 1) dated 25 Sep. 2000, the contents of which is incorporated herein by cross-reference.

For the coder, CX is a label that represents the context used to produce compressed data. CX selects the probability estimate to use during the encoding of data or decision D. The binary arithmetic coding is based on the recursive probability interval subdivision of Elias coding. With each binary decision the current probability interval is subdivided into two sub-intervals. The code string may be modified to point to the base or lower bound of the probability sub-interval assigned to the symbol. For the partitioned current interval, a sub-interval the more probable symbol (MPS) is ordered above the sub-interval for the less probable symbol (LPS).

Coding operations are performed using fixed precision integer arithmetic and use an integer representation of fractional values. In particular, decimal 0.75 is represented by 0x8000. An interval A is kept in the range of 0.75<= A<1.5 (where "<=" means less than or equal to) by doubling the interval whenever the integer value is lower than 0x8000. C represents the code register. Qe is the current estimate of the LPS probability. A-Qe is the sub-interval of the MPS, and Qe is the sub-interval for the LPS. D and CX are read and passed for encoding as pairs, and this continues until all pairs have been is read. In FIG. 26, RENORME stands for Renormalization in the encoder. Further information about the standard aspects of CODEMPS encoding can be found in Annex C "Arithmetic entropy coding" of Coding of Still Pictures, JPEG 2000 Part I Final Draft International Standard (ISO/IEC JTC 1/SC 29/WG 1) dated 25 Sep. 2000, the contents of which are incorporated herein by cross-reference.

I(CX) is an index stored for the context CX. NMPS represents the next MPS index.

Referring to FIG. 26, processing commences in step 2610. In step 2612, the number of repeats "r" is calculated at the floor value of (A-0x8000)/Qe(I(CX)). That is, the number of repeats r that can be processed before A is smaller than 0x8000 at which the probability is updated is first calculated. In decision block 2614, a check is made to determine if r>1. From an AC point of view, the speed-up is not restricted to RUN LENGTH only. However from the context generator point of view RUN LENGTH is the only occasion in which Repeat can be greater than 1. If decision block 2614 returns true (Y), processing continues via the modification beginning at step 2642.

Regarding the modifications, in decision block 2642, the number of repeats (r) that can be processed is compared with the repeat number (Repeat) in the command to determine if r is greater than Repeat. If decision block 2642 returns true (Y) indicating that r is greater than Repeat, processing continues at step 2646. That is, the command can be processed in a clock cycle, In step 2646, the following actions are performed: (1) A=A−Repeat*Qe(I(CX)); (2) C=C+Repeat*Qe(I(CX)); and Repeat=0. That is, the command updates the interval and the code word register, and sets Repeat equal to zero. Processing continues at decision step 2633. In step 2633, a check is made to determine if Repeat>0. If decision block 2633 returns true (Yes), processing continues at step 2612. Otherwise, if step 2633 returns false (No), processing terminates in step 2634.

Otherwise, if decision block 2642 returns false (N) indicating that r<Repeat, processing continues at step 2644. In step 2644, the following actions are performed: (1) A=A−r*Qe(I(CX)); C=C+r*Qe(I(CX)); and (3) Repeat=Repeat−r. That is, the command updates the interval and the code word register, and reduces Repeat by r. The same command with the reduced Repeat is processed in the next clock cycle. Processing continues at decision step 2633.

Otherwise, if decision block 2614 returns false (N) indicating that the number of repeats is not greater than 1 or the context is not RUN LENGTH, a normal coding path is taken (steps 2616–2630). In step 2616, the interval A is updated (A=A−Qe(I(CX))). In decision block 2618, a check is made to determine if ANDing A and 0x8000 is equal to zero. This indicates that A is too small (<0.75). If decision block 2618 returns false (N), processing continues at step 2620. In step 2620, the code word register is updated (C=C+Qe(I(CX))). Processing continues at step 2632 and Repeat is decremented by one. Processing then continues at decision step 2633. Otherwise, if decision block 2618 returns true (Y), processing continues at decision block 2622. In decision block 2622, a check is made to determine if A<Qe(I(CX)). If decision block 2622 returns false (N), processing continues at step 2626. In step 2626, the code word register is updated as per step 2620. Processing then continues at step 2628. Otherwise, if decision block 2622 returns true (Y), processing continues at step 2624. In step 2624, the interval is set equal to Qe(I(CX)). Processing then continues at step 2628.

In step 2628, the index I(CX) is set equal to the next index NMPS(I(CX)). In step 2630, renormalization in the encoder is performed. Processing then continues in step 2632 where Repeat is decremented by one, before continuing at decision step 2633.

6. Computer Implementation

Aspects of the embodiments of the invention can implemented using a general-purpose computer. In particular, the processing or functionality can be implemented as software, or a computer program, executing on the computer. The method or process steps for entropy encoding of discrete wavelet transform (DWT) coefficient bits that are arranged into code blocks and coded in bitplane order using three coding passes for each bitplane may be effected by instructions in the software that are carried out by the computer. The software may be implemented as one or more modules for implementing the process steps. A module is a part of a computer program that usually performs a particular function or related functions. Also, as described hereinbefore, a module can also be a packaged functional hardware unit for use with other components or modules.

The software may be stored in a computer readable medium, including the storage devices described below. The software is preferably loaded into the computer from the computer readable medium and then carried out by the computer. A computer program product includes a computer readable medium having such software or a computer program recorded on it that can be carried out by a computer. The use of the computer program product in the computer preferably effects advantageous apparatuses for trading goods or services or both using an electronic network.

The computer readable medium can include one or more of the following: a floppy disc, a hard disc drive, a magneto-optical disc drive, CD-ROM, magnetic tape or any other of a number of non-volatile storage devices well known to those skilled in the art. The program may be supplied to the user encoded on a CD-ROM or a floppy disk, or alternatively could be read by the user from the network via a modern device connected to the computer, for example. Still further, the software can also be loaded into the computer system from other computer readable medium including magnetic tape, a ROM or integrated circuit, a magneto-optical disk, a radio or infra-red transmission channel between the computer and another device, a computer readable card such as a PCMCIA card, and the Internet and Intranets including email transmissions and information recorded on websites and the like. The foregoing are merely examples of relevant computer readable mediums. Other computer readable mediums may be practiced without departing from the scope and spirit of the invention.

The foregoing is simply provided for illustrative purposes and other configurations can be employed without departing from the scope and spirit of the invention. Computers with which the embodiment can be practiced include IBM-PC/ATs or compatibles, one of the Macintosh (TM) family of PCs, Sun Sparcstation (TM), a workstation or the like. The foregoing are merely examples of the types of computers with which the embodiments of the invention may be practiced. Typically, the processes of the embodiments, are resident as software or a program recorded on a hard disk drive as the computer readable medium, and read and controlled using the processor. Intermediate storage of the program and intermediate data and any data fetched from the network may be accomplished using the semiconductor memory, possibly in concert with the hard disk drive.

In the foregoing manner, a method, an apparatus, and a computer program product for entropy encoding of discrete wavelet transform (DWT) coefficient bits that are arranged into code blocks and coded in bitplane order using three coding passes for each bitplane are disclosed. Preferably, the entropy coding is JPEG 2000 entropy coding. While only a small number of embodiments are described, it will be apparent to those skilled in the art in view of this disclosure that numerous changes and/or modifications can be made without departing from the scope and spirit of the invention.

The claims defining the invention are as follows:

1. A method of entropy coding of discrete wavelet transform coefficient bits that are arranged in code blocks and coded in bitplane order using three coding passes for each bitplane, said method including the steps of:
   pre-analyzing transform coefficients of a code block in sign-magnitude form to determine statistical data about the coefficients;
   storing the statistical data; and
   generating, based upon the statistical data, a command for arithmetic encoding of a sequence, wherein the sequence comprises a plurality of bit and context pairs for the code-block, and wherein the command specifies a length of the sequence.

2. The method according to claim 1, wherein the statistical data is stored with the coefficients.

3. The method according to claim 1, further including the step of buffering significance state data, coded data, magnitude refinement data, bit data, and sign data for the code block.

4. The method according to claim 3, wherein said buffering step is implemented using register arrays for context generation.

5. The method according to claim 4, further including the step of switching to a specific region of the code block in any one of significance propagation, magnitude refinement, and cleanup coding passes.

6. The method according to claim 5, wherein said switching step is implemented using rotate-left and rotate-up operations of the register arrays.

7. The method according to claim 1, further including the step of buffering bit and context data before arithmetic coding using the bit and context data.

8. The method according to claim 7, wherein bit, context and the number of bit and context pairs are buffered.

9. The method according to claim 8, wherein said buffering step is implemented using a FIFO.

10. The method according to claim 1, further including the steps of:
    buffering a region of a code block, the region being currently coded; and
    buffering separately the remaining regions of the code block.

11. The method according to claim 10, wherein:
    said buffering step for the region being currently coded is implemented using a register window; and
    said buffering step for the remaining regions is implemented using a scratch memory.

12. The method according to claim 1, further including the steps of:
    looking for, using a bypass control module, the next region of a code block to be coded in each of significance propagation, magnitude refinement, and cleanup coding passes; and
    generating, using a context generation module, a context of a region previously provided by the bypass control module, the bypass control and context generation modules operating in parallel.

13. The method according to claim 12, further including the step of communicating data between the bypass control and context generation modules using a bus, the bus including a control bus and a data bus, the control bus providing an indication of which column to start in a region when the context generation module processes the region.

14. The method according to claim 13, further including the step of detecting termination of processing in the context generation module for each pass, the detected termination enabling coding in the region to be terminated before scanning to a last column.

15. The method according to claim 1, wherein the entropy coding is JPEG 2000 entropy coding.

16. A method according to claim 1, wherein the statistical data comprises a predicted significance state after a first cleanup coding pass.

17. An apparatus for entropy coding of discrete wavelet transform coefficient bits that are arranged in code blocks and coded in bitplane order using three coding passes for each bitplane, said apparatus including:
    means for pre-analyzing transform coefficients of a code block in sign-magnitude form to determine statistical data about the coefficients;
    means for storing the statistical data; and
    means for generating, based upon the statistical data, a command for arithmetic encoding of a sequence, wherein the sequence comprises a plurality of bit and context pairs for the code-block, and wherein the command specifies a length of the sequence.

18. The apparatus according to claim 17, wherein the statistical data is stored with the coefficients.

19. The apparatus according to claim 17, further including means for buffering significance state data, coded data, magnitude refinement data, bit data, and sign data for the code block.

20. The apparatus according to claim 19, wherein said buffering means comprises register arrays for context generation.

21. The apparatus according to claim 20, further including means for switching to a specific region of the code block in any one of significance propagation, magnitude refinement, and cleanup coding passes.

22. The apparatus according to claim 21, wherein said switching means implements rotate-left and rotate-up operations of the register arrays.

23. The apparatus according to claim 17, further including means for buffering bit and context data before arithmetic coding using the bit and context data.

24. The apparatus according to claim 23, wherein bit, context and the number of bit and context pairs are buffered.

25. The apparatus according to claim 24, wherein said buffering means is a FIFO.

26. The apparatus according to claim 17, further including:
means for buffering a region of a code block, the region being currently coded; and
means for buffering separately the remaining regions of the code block.

27. The apparatus according to claim 26, wherein:
said buffering means for the region being currently coded is a register window; and
said buffering means for the remaining regions is implemented using a scratch memory.

28. The apparatus according to claim 17, further including:
a bypass control module for looking for the next region of a code block to be coded in each of significance propagation, magnitude refinement, and cleanup coding passes; and
a context generation module for generating a context of a region previously provided by the bypass control module, the bypass control and context generation modules operating in parallel.

29. The apparatus according to claim 28, further including a bus for communicating data between the bypass control and context generation modules, the bus including a control bus and a data bus, the control bus providing an indication of which column to start in a region when the context generation module processes the region.

30. The apparatus according to claim 29, further including means for detecting termination of processing in the context generation module for each pass, the detected termination enabling coding in the region to be terminated before scanning to a last column.

31. The apparatus according to claim 17, wherein the entropy coding is JPEG 2000 entropy coding.

32. A computer program product having a computer readable medium having a computer program recorded therein for entropy coding of discrete wavelet transform coefficient bits that are arranged in code blocks and coded in bitplane order using three coding passes for each bitplane, said computer program product including:
computer program code means for pre-analyzing transform coefficients of a code block in sign-magnitude form to determine statistical data about the coefficients;
computer program code means for storing the statistical data; and
computer program code means for generating, based upon the statistical data, a command for arithmetic encoding of a sequence, wherein the sequence comprises a plurality of bit and context pairs for the code-block and wherein the command specifies a length of the sequence.

33. The computer program product according to claim 32, wherein the statistical data is stored with the coefficients.

34. The computer program product according to claim 32, further including computer program code means for buffering significance state data, coded data, magnitude refinement data, bit data, and sign data for the code block.

35. The computer program product according to claim 34, wherein said buffering computer program code means implements register arrays for context generation.

36. The computer program product according to claim 35, further including computer program code means for switching to a specific region of the code block in any one of significance propagation, magnitude refinement, and cleanup coding passes.

37. The computer program product according to claim 36, wherein said computer program code means for switching implements rotate-left and rotate-up operations of the register arrays.

38. The computer program product according to claim 32, further including computer program code means for buffering bit and context data before arithmetic coding using the bit and context data.

39. The computer program product according to claim 38, wherein bit, context and the number of bit and context pairs are buffered.

40. The computer program product according to claim 39, wherein said buffering computer program code means implements a FIFO.

41. The computer program product according to claim 32, further including:
computer program code means for buffering a region of a code block, the region being currently coded; and
computer program code means for buffering separately the remaining regions of the code block.

42. The computer program product according to claim 41, wherein:
said computer program code means for buffering the region being currently coded is a register window; and
said buffering means for the remaining regions is a scratch memory.

43. The computer program product according to claim 32, further including:
computer program code means for implementing a bypass control module to look for the next region of a code block to be coded in each of significance propagation, magnitude refinement, and cleanup coding passes; and
computer program code means for context generation module to generate a context of a region previously provided by the bypass control module, the bypass control and context generation modules operating in parallel.

44. The computer program product according to claim 43, further including a bus for communicating data between the bypass control and context generation modules, the bus including a control bus and a data bus, the control bus providing an indication of which column to start in a region when the context generation module processes the region.

45. The computer program product according to claim 44, further including computer program code means for detecting termination of processing in the context generation module for each pass, the detected termination enabling coding in the region to be terminated before scanning to a last column.

46. The computer program product according to claim 32, wherein the entropy coding is JPEG 2000 entropy coding.

* * * * *

UNITED STATES PATENT AND TRADEMARK OFFICE
CERTIFICATE OF CORRECTION

PATENT NO. : 6,947,874 B2
DATED : September 20, 2005
INVENTOR(S) : Yu-Ling Chen

It is certified that error appears in the above-identified patent and that said Letters Patent is hereby corrected as shown below:

<u>Title page</u>,
Item [*] Notice, "367 days." should read -- 392 days. --.

<u>Drawings</u>,
Sheet 18, Figure 17, "R= "0" should read -- R="0" --.

<u>Column 1</u>,
Line 10, "1080's," should read -- 1980s, --; and
Line 13, "images," should read -- images. --.

<u>Column 4</u>,
Line 21, "ran" should read -- run --.

<u>Column 5</u>,
Line 49, "one" should read -- one of --.

<u>Column 6</u>,
Line 30, "(e.g." should read -- (e.g., --.

<u>Column 7</u>,
Line 15, "scans (e.g. 212)" should read -- scan_y (e.g., 212) --; and
Line 16, "(e.g. 212)," should read -- (e.g., 212), --.

<u>Column 8</u>,
Line 20, "passes" should read -- passes. --.

<u>Column 9</u>,
Line 60, "coder 130" should read -- coder 130. --.

<u>Column 10</u>,
Line 38, "rive" should read -- five --; and
Line 48, "bins" should read -- bits --.

<u>Column 11</u>,
Line 56, "or" should read -- of --.

<u>Column 13</u>,
Line 27, "sit" should be deleted;
Line 44, "unidirectional" should read -- uni-directional --; and
Line 45, "unidirec-" should read -- uni-direc- --.

UNITED STATES PATENT AND TRADEMARK OFFICE
CERTIFICATE OF CORRECTION

PATENT NO. : 6,947,874 B2
DATED : September 20, 2005
INVENTOR(S) : Yu-Ling Chen

It is certified that error appears in the above-identified patent and that said Letters Patent is hereby corrected as shown below:

Column 14,
Line 53, "interface," should read -- interface. --.

Column 15,
Line 19, "pass," should read -- pass. --.

Column 16,
Line 28, "performed" should read -- performed. --;
Line 47, "a 8x4" should read -- an 8x4 --;
Line 52, "(e.g." should read -- (e.g., --;
Line 54, "available" should read -- available. --; and
Line 65, "N2)" should read -- (N2) --.

Column 17,
Line 9, "to 1" should read -- to 1. --;
Line 14, "read" should read -- read. --;
Line 23, "block 3526" should read -- block 1526 --; and
Line 56, "e.g." should read -- e.g., --.

Column 18,
Line 7, "coded" should read -- coded. --;
Lines 46 and 55, "AllInsig_n" should read -- AllInsig_n --; and
Line 64, "Tocode" should read -- Tocode_n --.

Column 19,
Line 2, "step 1732" should read -- step 1732. --; and
Line 64, "pass" should read -- pass. --.

Column 20,
Line 11, "e.g." should read -- e.g., --;
Line 32, "R, 1916," should read -- R 1916, --, and "column S." should read -- column 8. --.

Column 21,
Line 34, "pass 2." should read -- pass = 2. --.

Column 22,
Table 6, "CG_Coded[8-n., 7]" should read -- CG_Coded[8-n..7] --.

UNITED STATES PATENT AND TRADEMARK OFFICE
CERTIFICATE OF CORRECTION

PATENT NO.     : 6,947,874 B2
DATED          : September 20, 2005
INVENTOR(S)    : Yu-Ling Chen It is certified that error appears in the above-identified patent and that said Letters Patent is hereby corrected as shown below:

Column 23,
Table 8, "when n≅O" should read -- when n=O: --, and "CG_Coded[0.7]" should read -- CG_Coded[0..7] --; and
Line 32, "the, result" should read -- the result --.

Column 24,
Line 50, "region" should read -- region. --; and
Line 61, "command" should read -- command. --.

Column 25,
Line 25, "coding" should read -- coding. --; and
Line 59, "e.g." should read -- e.g., --.

Column 26,
Line 14, "encoder 2820" should read -- encoder 2820. --;
Line 16, "inputs" should read -- inputs to --;
Line 56, "Note" should read -- a. Note --; and
Line 58, "$^b$X = do" should read -- b. X = do --.

Column 27,
Line 32, "a"X"" should read -- a. "X" --; and
Line 67, "command" should read -- command. --.

Column 29,
Line 34, "is" should be deleted; and
Line 62, "cycle," should read -- cycle. --.

UNITED STATES PATENT AND TRADEMARK OFFICE
CERTIFICATE OF CORRECTION

PATENT NO. : 6,947,874 B2
DATED : September 20, 2005
INVENTOR(S) : Yu-Ling Chen

It is certified that error appears in the above-identified patent and that said Letters Patent is hereby corrected as shown below:

Column 30,
Line 39, "can" should read -- can be --.

Signed and Sealed this

Eighteenth Day of April, 2006

JON W. DUDAS
*Director of the United States Patent and Trademark Office*